(12) United States Patent
McDonald

(10) Patent No.: US 7,989,987 B2
(45) Date of Patent: Aug. 2, 2011

(54) PHOTON INITIATED MARXED MODULATORS

(76) Inventor: Kenneth Fox McDonald, Columbia, MO (US)

( * ) Notice: Subject to any disclaimer, the term of this patent is extended or adjusted under 35 U.S.C. 154(b) by 358 days.

(21) Appl. No.: 11/423,102

(22) Filed: Jun. 8, 2006

(65) Prior Publication Data

US 2008/0036301 A1    Feb. 14, 2008

Related U.S. Application Data

(60) Provisional application No. 60/595,120, filed on Jun. 8, 2005.

(51) Int. Cl.
*H02M 3/18*     (2006.01)
*H03K 3/352*   (2006.01)

(52) U.S. Cl. .................. 307/108; 307/106; 307/110

(58) Field of Classification Search .............. 307/106, 307/108, 110
See application file for complete search history.

(56) References Cited

U.S. PATENT DOCUMENTS

| | | | | |
|---|---|---|---|---|
| 3,746,881 A * | 7/1973 | Fitch et al. ................... | 307/110 |
| 3,783,289 A * | 1/1974 | Hafner ......................... | 378/103 |
| 3,845,322 A * | 10/1974 | Aslin ........................... | 307/108 |
| 3,863,105 A * | 1/1975 | Ewanizky .................... | 315/245 |
| 4,275,317 A * | 6/1981 | Frosch et al. ................ | 307/415 |
| 4,375,594 A * | 3/1983 | Ewanizky, Jr. .............. | 307/110 |
| 4,577,114 A | 3/1986 | Levy et al. | |
| 4,900,947 A * | 2/1990 | Weiner et al. ................ | 307/110 |
| 4,996,494 A * | 2/1991 | Ranon .......................... | 327/108 |
| 5,153,460 A * | 10/1992 | Bovino et al. ............... | 307/108 |
| 5,307,079 A * | 4/1994 | Ross et al. ................... | 343/822 |
| 5,311,067 A * | 5/1994 | Grothaus et al. ............ | 307/108 |
| 5,621,255 A * | 4/1997 | Leon et al. ................... | 307/106 |
| 6,078,110 A * | 6/2000 | Zakharian .................... | 307/109 |
| 6,154,477 A | 11/2000 | Weidenheimer et al. | |
| 6,608,405 B1 * | 8/2003 | Zakharian .................... | 307/109 |
| 7,170,198 B2 * | 1/2007 | Sack ............................. | 307/106 |
| 7,209,373 B2 * | 4/2007 | Oicles et al. ................. | 363/59 |
| 7,301,250 B2 * | 11/2007 | Cassel ......................... | 307/106 |

* cited by examiner

*Primary Examiner* — Jared J Fureman
*Assistant Examiner* — Adi Amrany

(57) ABSTRACT

The features of this invention allow construction and operation of a variety of high voltage, high repetition rated pulse generators of the Marx type that are switched with photon initiated semiconductor switches of the closing type. The photon initiated semiconductor switches can be constructed with bulk materials or in layered devices such as thyristors. Variations on the invention permit the formation of shaped high voltage pulses; particularly those that are nearly rectangular: with controlled rise and fall times, minimal or no overshoot, and minimal voltage ripple.

18 Claims, 23 Drawing Sheets

PHOTON INITIATED MARXED MODULATORS

BACKGROUND OF THE INVENTION

1. Field of the Invention (Technical Field)

The present invention relates primarily to the circuit topology invented by Erwin Marx in 1923; secondarily to circuit topologies that synthesize nearly rectangular, flat-topped pulses; and finally to optically triggered semiconductor switches.

The Marx Generator principle works by charging a plurality of capacitive energy storage elements (electrostatic energy stores) in parallel and discharging them in series through a plurality set of switches. Each capacitor energy store and switch set is considered to be a "stage". Each stage can be comprised of a plurality of series and/or parallel connected energy storage elements or switches. For example, each Marx stage "switch" could be comprised of an N by M matrix of series/parallel switches. The output voltage at the terminus of the Marx Generator is typically equal to the charge voltage times the number of stages in the Marx. This circuit is analogous to putting flashlight batteries in series to increase the voltage across the bulb; however it typically works at high voltages. For example, a 100 stage Marx Generator that is charged to 10 kV per stage can produce approximately 1,000 kV at the load. Likewise, a 10 stage Marx that is charged to 100 kV per stage will produce approximately the same voltage at the load.

Marx generators also require ancillary systems for charging and triggering. The charge system consists of a power supply, power supply protection circuitry, and contain sets of charge/isolation elements that permit charging of the energy storage capacitors from a low voltage power supply (relative to the erected Marx voltage), but minimize the circulating energy losses during the pulse discharge. These elements are almost always resistors or inductors. Diodes can be used on the positive charge leg of some small, lower voltage, Marx generators, but cannot be used on the negative side as they will conduct during the discharge cycle. Resistors disipate more energy, but inductors frequently pose problems for some power supply topologies. The charge scheme can be either unipolar or bipolar. Marx generators also require a switch trigger subsystem. Spark gap systems usually trigger only the first few switches, but employ resistor chains and/or stray capacitance to assist with triggering the downstream gaps, which are naturally overvolted by the erection of the previous stages. Solid state systems require triggers for all of the switches. Electrically triggered switches must employ a high voltage isolation scheme (usually optical isolators or fiber optic cables) to protect the trigger generator during Marx erection. Optically triggered switches can be illuminated through free space, or via fiber optic cables. Because very high voltage systems require emersion in an insulating media (such as transformer oil) fiber optic bundle transport is mandatory unless diode lasers or fiber lasers are embedded with each switch. Fiber optic bundles can be illuminated by a single pulsed laser.

The series switches in conventional Marx Generators are typically gas insulated spark gaps that are constructed of two principal electrodes and usually contain a subsidiary trigger electrode.

The term modulator is derived from a modulated signal, particularly those electrical signals supplied to drive physical apparatus such as radar sets, lasers, etc. The modulator produces a pulse train that has specific amplitude, pulse shape, duration and inter-pulse period. For example, a typical modulator may produce a series of 100,000 V, one (1) microsecond long flat-top pulses at a pulse repetition rate of 100 pulses per second (Hz). A modulator typically employs pulse forming networks that tailor the pulse to obtain specific voltages, impedances, pulse durations, rise-times, fall-times, and amplitude fidelity. Although most physical apparatus require pulses that are nominally trapezoidal in shape, some of these devices can be operated with a double exponential wave shape manifest to a simple Marx generator with capacitors for energy storage elements.

2. Background Art

Note that the following discussion is given for more complete background of the scientific principles and is not to be construed as an admission that such concepts are prior art for patentability determination purposes.

Pulse power systems, such as particle beam accelerators, fusion apparatus, lasers, high power microwave systems, etc.; require high voltage electrical pulses to function properly. These requirements are currently met with different circuit topologies selected according to the desired pulse shape parameters and repetition rate specifications. Three of the most common existing techniques include simple Marx generators, where double exponential pulse shapes are acceptable; Marx generators driving pulse forming lines where short, flat-topped pulses are required; and pulse forming networks in conjunction with pulse transformers for long duration, flat-topped pulses for systems operated at modest to high repetition rates, especially for long lifetimes.

Martin Sack introduced a new Marx spark gap triggering mechanism in U.S. Pat. No. 7,170,198 B2. Sack triggers two electrode spark gaps by configuring the charge/isolation inductors to also serve as the secondary of trigger transformers. When voltage pulses are applied to the primary of the transformers, the spark gaps are overvolted and break down to initiate Marx erection. Sack mentions that the spark gap trigger generators are themselves triggered via light signals transmitted through optical fibers, but this is a standard method of achieving high voltage isolation and has no bearing on this disclosure. The Sack patent pertains exclusively to spark gap switched Marx generators and therefore has no relevance to the solid state switched Marx generators described herein.

Simple Marx generators using capacitive energy storage elements and spark gap switches have been able to satisfy many of the requirements for laboratory experiments, but are not suitable for reliable, long-life operation at high repetition rates, e.g., greater than a few tens of Hertz and a few million pulses before refurbishment. Furthermore, the simple Marx generator produces a double exponential pulse shape that is not acceptable for many applications. Finally, the spark gaps limit the system reliability, repetition rate, and lifetime between maintenance cycles.

When relatively short flat topped pulses are required, Marx generators are frequently coupled with pulse forming lines (typically oil or deionized water filled co-axial cylinders) to generate rectangular pulses on the order of one hundred nanoseconds duration. However, a water pulse forming line would have to be over fifty feet long to produce a one microsecond pulse, making it unpractical for the long pulse parameter space. Moreover, systems using Marx generators and pulse forming lines require a high voltage output switch between the pulse forming line and the load. Since no existing high voltage output switch can operate reliably at high repetition rates for long life cycles, this topology is not practical for most repetition rated devices. Marx spark gaps also limit reliability and lifetime. Finally, the additional weight, volume, and ancillary systems requisite to the deionized water pulse forming line and high voltage output switch limit the utility of such systems.

Single shot spark gap switched Marx generators have also been built by replacing the capacitors with pulse forming networks to simultaneously multiply the voltage and shape the pulse. Such Marxed-PFN's (High Energy Density Pulsers) were fabricated by the Air Force Weapons Laboratory in Albuquerque, N. Mex. in the 1960's. Twenty, Five-section, 25 kV ceramic capacitor pulse forming networks were Marxed together with spark gaps to create single shot 250 kV, 70 ns long pulses into a 70 Ohm load.

Systems that require high voltage, long duration flat-topped pulses operated at high repetition rates have been satisfied by using circuits that incorporate Pulse Forming Networks with hydrogen thyratron switches and transformers to produce shaped pulses at high voltages. However the self inductance of these transformers typically prohibits fast risetimes for such systems, and the energy lost in the rise and fall portions of the pulse lead to inefficiencies. Furthermore, such transformers are typically large and heavy and require reset circuits, all of which limits their utility.

Theodore F. Ewanizky, Jr. attempted to address the inability of the Marx generator to operate at repetition rates by substituting hydrogen thyratron switches in place of spark gaps to achieve greater pulse repetition rates and longer lifetimes; as described in U.S. Pat. No. 4,375,594: "Thyratron Marx High Voltage Generator". However, this circuit never attained popular acceptance, probably because it is difficult to implement the heater, reservoir, and trigger circuits at the various high voltages present during the discharge of a Marx generator. Additionally, the system cost would typically be very high because of the high cost of requisite hydrogen thyratrons and the ancillary equipment and hardware required to operate the tubes. Finally, the thyratrons are typically large and difficult to mount into low inductance configurations requisite to fast rise times.

In U.S. Pat. No. 7,301,250: "High Voltage Pulsed Power Supply Using Solid State Switches", Richard Cassel employs a Marx circuit topology to generate continuous duty, repetition rate, rectangular pulses by using capacitors that are charged in parallel and discharged in series through electrically triggered semi-conductor (solid state) switches that possess both "ON" and "OFF" capabilities. The energy stored in the Cassel circuit is much greater than that delivered to the load in a single pulse. This large capacitance increases the RC time constant, thus minimizing the pulse droop. The Cassel switches are turned on to initiate the pulse, and off to truncate the pulse at the desired pulse length. No existing photon initiated or photoconductive switches have demonstrated turn-off capabilities, and are therefore not applicable to the Cassel circuit. While sharing some similarities, the Cassel circuit differs substantially from that of the invention disclosed herein because Cassel uses a large capacitance instead of either discrete Transmission Lines or Pulse Forming Networks (that synthesize the rectangular pulses intrinsic to transmission lines) manifest to this disclosure. Furthermore, Cassel's circuit is incapable of generating rectangular pulses with closing only switches such as the photon initiated thyristors proposed herein, which do not have turnoff capabilities. Cassel makes no mention of pulse shaping via Transmission Lines or Pulse Forming Networks in lieu of the Marx stage capacitors; or of the use of "On-Only" semiconductor switches (of the closing type) such as thyristors (either electrical or optical.) Moreover, Cassel does not claim or reference optical semiconductor switches (either bulk photoconductive devices or photonically initiated multilayer devices such as the optically triggered thyristor architectures disclosed herein.)

In U.S. Pat. No. 4,900,947: "Asynchronous Marx Generator Utilizing Photo-Conductive semiconductor Switches", Maurice Weiner, et. al. employ sequential firing of bulk small, large bandgap, photo conductive semi-conductor switches to achieve ultra-fast risetimes of less than one nanosecond into low impedance loads for small low energy transfer, insulator board mounted applications. Note reference to Levy, et al. U.S. Pat. No. 4,577,114, and to patent application Ser. No. 111,746. Weiner states that: "Typically these switches are blocks of bulk semi-insulating gallium arsenide with ohmic contacts at two ends . . . ." The carrier density of the gallium arsenide is substantially increased by irradiating it with a laser, thus creating a low resistance path between the ohmic contacts and closing the switch." The Weiner circuit This process is effective principally because of the transmission line characteristics of the ultra-fast wave front, which inherently delays the pulse arrival time to each successive switch. The switches are triggered sequentially to coordinate with the arrival time of the transmission line wavefront. Achieving sub-nanosecond rise times into low impedance loads is a difficult task; and Weiner makes mandatory modifications to the Marx circuit (col. 1, lines 37-44), which result in crucial sacrifices to the utility of his patent. These required modifications and their consequences are discussed in the following paragraphs.

Weiner circuit modification 1: reflections must be eliminated to minimize the rise time, thereby requiring that the load resistance (Weiner FIG. 1-500) equal that of the Marx characteristic impedance (Weiner col. 4, lines 48-50), which is defined by the series inductance and the stray capacitance to the ground plane on the back side of the insulator board (Weiner col. 3, lines 48-53). The consequence of this requirement is: the output voltage (across 500) is reduced to one-half of that produced by a conventional Marx generator (given the same number of components and operating parameters). The combination of low Marx characteristic impedance and the load resistor-matching requirement severely restricts the range of applications and utility of this circuit. This restriction is significantly different than that of the invention disclosed herein because the present invention does not place any limitations on the output load resistance, except that it be significantly larger than the Marx characteristic impedance, which is the typical case. Therefore, the voltage across the load in the present circuit is nearly N*V, where N is the number of Marx stages, and V is the initial charge voltage. Hence, the versatility is greatly increased over the Weiner patent.

Weiner circuit modification 2: the backwards wave must be terminated with an input resistor (Weiner FIG. 1-600) that matches the characteristic impedance of the Marx. The consequence of this requirement is: a significant portion of the circuit energy is absorbed by the input resistor, thereby reducing the system efficacy. This restriction is significantly different than that of the invention disclosed herein because the present invention does not have an input resistor. Hence, almost all of the stored energy is deposited in the load thus maximizing the efficacy. The embodiment disclosed herein generates the same voltage and delivers the same energy to the load as the Weiner circuit with only ½ the number of capacitors and switches operated under the same conditions.

Weiner circuit modification 3: large band gap, photoconductive, bulk semiconductor switches (such as gallium arsenide) must be used to attain the required fast switching times; and the triggers must coordinate with the arrival time of the transmission line wave front. The consequence of these requirements are: the bulk photoconductive semiconductor switches identified by Weiner are intrinsically incapable of transferring large energies over long time durations, again restricting the range of potential applications. Moreover, all of the charge carriers in bulk photoconductive switches must be generated by photons in time scales less than the pulse duration, which places a high demand on the photon source. Finally, the Weiner circuit requires sequential triggering of the switches to exploit the transmission line characteristics of the Marx and thereby minimize the pulse rise time. These restrictions are significantly different than that of the invention disclosed herein because the present invention capitalizes on lower band-gap, multilayer devices (such as silicon thyristors), which can accommodate the high voltage, long duration, high current pulses requisite to numerous applications. Moreover such devices are photon initiated—but can transition to a self-sustained mode in the same manner as an electrically triggered device. Both the present disclosure and Weiner employ semiconductor Marx switches; but these switches are radically different in both architecture and performance metrics and neither can satisfy the requirements of the other. While both switch designs employ semiconductor materials and photons, they are mutually exclusive. Because the rise time of the larger embodiments disclosed herein is dominated by the inductance of the components and circuit; benefits derived from sequential triggering (to capitalize on the transmission line effect), are non-existent or inconsequential. Moreover, simultaneous triggering is probably desirable from a fault protection viewpoint.

Weiner circuit modification 4: small embodiments, e.g., insulator board mounted systems, are required to reduce the inductance to levels commensurate with sub-nanosecond rise times. This is especially true given that the load resistance must be small to match that of the Marx characteristic impedance and the exponential rise time is dominated by the $L_{series}/R_{load}$ time constant. The consequence of this requirement is: the Weiner circuit is incapable of storing and transferring high energy, long duration pulses because the physical size of such energy storage devices is incompatible with sub-nanosecond rise times. This restriction is significantly different than that of the invention disclosed herein because the present invention is specifically designed to store and efficiently transfer large energies to the load, which can have a wide range of resistances without affecting the utility of the circuit. Albeit, sub-nanosecond rise times are essentially impossible with the large energy configurations claimed herein because of the intrinsic inductance manifest to the typically large components and layout.

Weiner also discloses that the electrostatic energy storage elements can be comprised of Pulse Forming Lines (PFL's), which are discrete transmission lines such as strip lines, coaxial cables, etc. Short pulse duration strip lines are consistent with the fabrication of strip lines onto insulator boards, albeit, these lines must be short or the GaAs switches will fail from excessive energy transfer. Furthermore, Weiner restricts the PFL impedance to be twice that of the Marx line characteristic impedance, thereby severely limiting the range of applications and utility of the circuit (Weiner col. 4, lines 53-58). Finally, the input resistor, 600, (which is required to match the PFL impedance) absorbs ½ of the energy stored in the PFL's by terminating the backwards wave and thereby truncating the pulse duration to ½ of the pulse length of a conventional PFL. This restriction is significantly different than that of the invention disclosed herein because the present invention resides in a completely different parameter space and the PFL's have no restrictions imposed by the Marx circuit. Rather, they are designed to match the load resistance (or perveance), thereby yielding high efficacy energy transfer to the load with an optimal, nearly rectangular, pulse shape, which is not truncated. Hence, the PFL's in these two circuit topologies are radically different in design and function; and the PFL disclosed herein does not duplicate or infringe on the Weiner PFL/patent. Weiner did not anticipate this disclosure or utilization. Moreover, in this disclosure, the PFL pulse durations have very few limitations and can extend to at least a few microseconds.

Weiner makes no claim to other methods of generating rectangular pulses: including either Pulse Forming Networks (comprised of networks of discrete capacitor and inductor pairs that are configured to synthesize a transmission line); or other novel circuits comprised of inductors, resistors and switches: both of which are disclosed herein. Moreover, Weiner makes does not discuss pulse repetition rate, fault protection circuitry, tuning capabilities to optimize the pulse shape, series/parallel configured switches (or energy storage elements), parallel PFL's, or parallel Marx generators.

Weiner could not have anticipated the embodiment disclosed herein, because his circuit is simply not applicable to any purpose other than to achieve an ultra fast rise time (into low impedance loads), with short pulse durations, and low energy transfer. Adaptation to any other purpose would violate the core tenets of his patent, e.g., the requirement of matching the load resistance to the Marx characteristic impedance is highly restrictive and renders the circuit impractical for virtually all of the applications addressed in this disclosure. The required use of sequential triggering and circuit modifications, including switch topology, component selection, load and input resistor values, circuit size and layout, and energy transfer capabilities, severely restrict the utility of the Weiner patent. The Weiner circuit is totally incapable of generating a pulse consistent with a high power microwave source, Radio Frequency Linear Accelerator Klystron, or electron beam device. Nor can it be modified to serve these purposes without violating virtually every core principal of the patent.

The switches described in U.S. Pat. No. 6,154,477: "On-Board Laser-Triggered Multi-Layer Semiconductor Power Switch", Douglas Weidenheimer, et. al., are representative of the types that may be utilized in the invention described herein.

There is a need for versatile, high energy, high average power, and long life pulse generators that are capable of generating high voltage electrical pulses with a variety of pulse shapes and durations while operating at high repetition rates. Particularly flat-topped, nearly rectangular pulses (perhaps better described as trapezoidal). Typical rise-times for these generators range from a few nanoseconds to several hundred nanoseconds; while typical pulse durations range from less than 10 nanoseconds to as much as a few milliseconds. Depending on the application, the flattopped voltage pulse may be on the order of 500 kV, with overshoot and ripple limited to values on the order of 5-10% (on the high side) to as small as 0.5% (or less) for high precision systems.

SUMMARY OF THE INVENTION

Disclosure of the Invention

It is an object of this invention to provide an improved high voltage generator with high energy transfer, long life, high repetition rate capabilities and minimal maintenance requirements.

It is another object of this invention to provide a repetition rated high voltage pulse generator with versatile pulse shaping capabilities.

It is a further object of this invention to provide a high voltage Marx type pulse generator wherein the Marx stage energy storage elements are comprised of either discrete Transmission Lines or Pulse Forming Networks (Pulse Forming Lines) to either intrinsically form rectangular pulses (transmission lines) or synthesize rectangular pulses (PFN's).

It is a further object of this invention to provide a high voltage Marx type pulse generator using highly reliable photon initiated semiconductor switches and photon triggering mechanism.

To achieve the foregoing objects, a plurality of photon initiated semiconductor switches that can be connected in series/parallel configurations are used as the switching elements in each stage of the Marx generator; an optical source (or sources) are used to generate the photons; and the photons are delivered to the semiconductor switches either directly from the optical source (or sources), or transmitted by fiber optic cables. Moreover, a plurality of either capacitors, transmission lines or pulse forming networks are employed as Marx stage energy storage devices to generate versatile, e.g., rectangular, pulse shapes at the load. Additional passive electrical elements, such as inductors, capacitors, and resistors may be connected to the output (high voltage) section of the Marx; or connected across a few of the initial Marx stages at the input (low voltage) section of the Marx (frequently in conjunction with additional photon initiated semiconductor switches). Finally, parallel Marx generators with capacitive energy stores can be fired at various times to synthesize different pulse shapes such as linear ramps or rectangular. The capacitance values for the parallel Marxes may be different to further improve the pulse shape.

Other objects, advantages and novel features, and further scope of applicability of the present invention will be set forth in part in the detailed description to follow, taken in conjunction with the accompanying drawings, and in part will become apparent to those skilled in the art upon examination of the following, or may be learned by practice of the invention. The objects and advantages of the invention may be realized and attained by means of the instrumentalities and combinations particularly pointed out in the appended claims.

BRIEF DESCRIPTION OF THE DRAWINGS

The accompanying drawings, which are incorporated into and form a part of the specification, illustrate several embodiments of the present invention and, together with the description, serve to explain the principles of the invention. The drawings are only for the purpose of illustrating a preferred embodiments of the invention and are not to be construed as limiting the invention. In the drawings.

DETAILED DESCRIPTION OF THE PREFERRED EMBODIMENTS

Best Modes for Carrying Out the Invention

Figure 1:
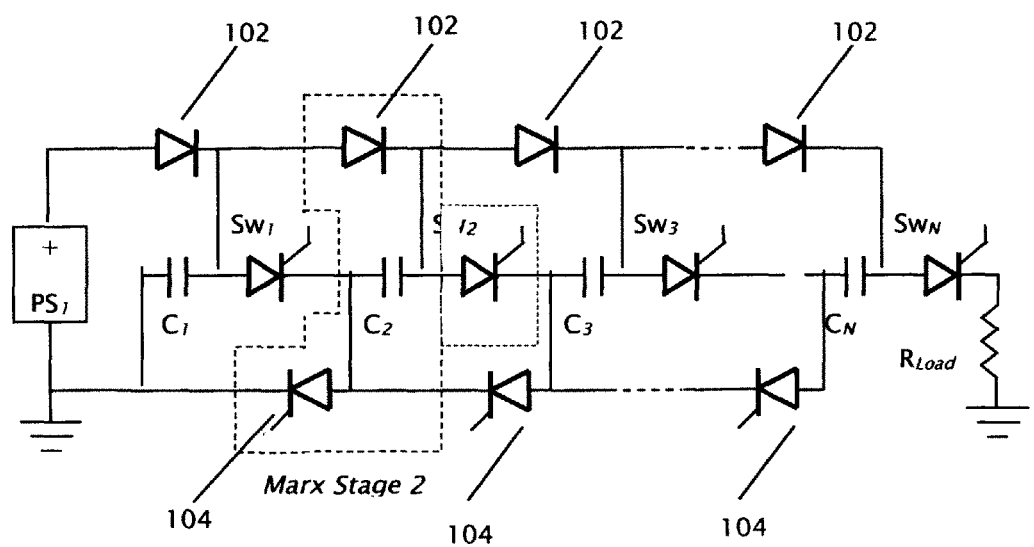
FIG. 1 is a simplified circuit diagram of the present invention with capacitive energy storage elements connected in a unipolar charge configuration
Figure 2:
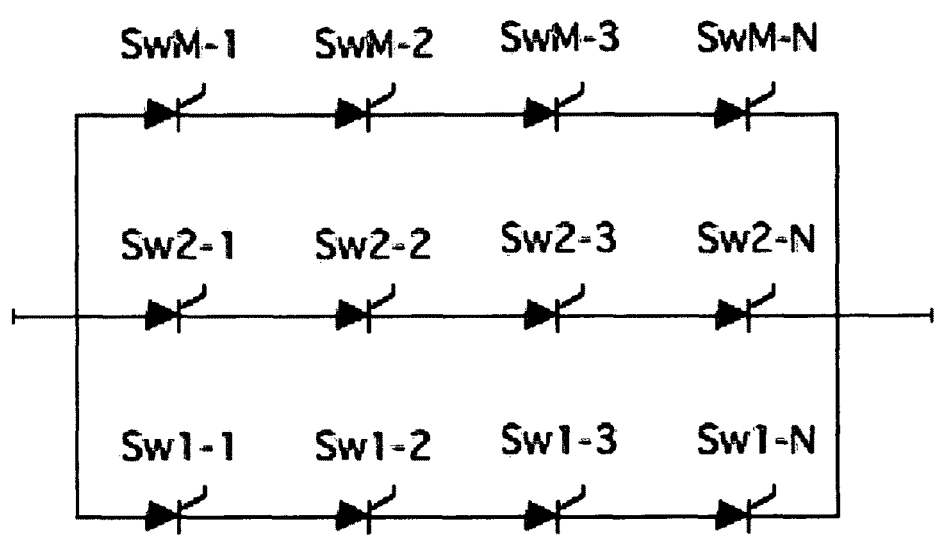
FIG. 2 is a simplified schematic of an N×M (4×3 shown), series/parallel optical thyristor switch array.

One preferred embodiment of the present invention is depicted in FIG. 1. The portion of the circuit commonly known as a Marx "Stage" is enclosed by the dashed lines. The inventive device can contain an arbitrary number of Marx Stages, denoted in FIG. 1 by the letter "N"; while each stage consists of a plurality of energy storage elements, shown in FIG. 1 by capacitors $C_1$ through $C_N$; a plurality (set) of photon initiated semiconductor switches, shown in FIG. 1 by switches $Sw_1$ through $Sw_N$; and a plurality (set) of positive and negative charge/isolation elements, shown in FIG. 1 by the positive side diodes [102] and the negative side solid-state switches [104]. The charge diodes [102] and the charge switches [104] can be comprised of sets of series diodes and switches. Moreover the charge diodes and switches may be replaced by either resistors or inductors, although resistors are not advisable for repetition rate duty. Moreover, the charge inductors may be physically wound and positioned so that the mutual coupling between the inductors will reduce the inductance seen by the power supply during the charge and will increase the mutual inductance seen by the energy storage elements during the discharge cycle. Each Marx stage can be comprised of an "N by M" matrix of series/parallel connected energy storage elements or switches, as illustrated by FIG. 2, which depicts a 3×2 matrix of photon initiated multi-layer thyristors. The plurality of energy storage elements can be connected in a matrix similar to that of the switches.

Operation of the inventive device has two phases: a charge phase and a discharge phase. The charge phase proceeds as follows: While all of the switch sets, $S_1$ through $S_N$, in FIG. 1, are in the open circuit condition; a power supply (or power supplies), denoted by reference number $PS_1$, charges the plurality of energy storage elements (capacitors, discrete Transmission Lines, or Pulse Forming Networks) denoted by $C_1$ through $C_N$; (via the charge-isolation elements) to the predetermined voltage, and holds the specified voltage at high precision until the discharge cycle is initiated by triggering the photon initiated semiconductor switches to create an output pulse at the desired repetition rate. The power supply ($PS_1$) (or supplies) charge the energy storage elements in parallel through the plurality of charge/isolation elements, denoted by the positive side diodes [102]; and by the negative side solid-state switches [104]. The charge elements can be comprised of a plurality of passive elements such as resistors, inductors, or diodes; or a plurality of active elements, including either electrically or optically triggered semiconductor switches. The charging system can be unipolar with a positive output by placing the ground as shown in FIG. 1; unipolar with a negative output by inverting the polarity of the power supply, $PS_1$ and reversing the anode/cathode connections on the switches, $Sw_1$ through $Sw_N$ in FIG. 1; or bipolar by placing the ground at point 2 in FIG. 1, where the output can be either positive or negative depending on the polarity of the power supply and the orientation of the switches. The type of charge/isolation element is not important for single shot Marx generators, but for repetition rate systems, the energy dissipation during the charge and discharge cycles can result in low system efficacy. Hence, resistors are typically not a good choice for repetition rate systems. While inductors can be low loss devices during the charge cycle, inductance values sufficient to prevent recirculation losses during the discharge cycle can be difficult to obtain and may require magnetic materials. Moreover these elements can represent an undesirable inductive load for some power supplies. This effect can be mitigated, however by using either bifilar or custom inductor windings, which can be positioned to cancel the magnetic field generated (by the positive and negative charge/isolation elements) during the charge cycle and thus minimize the inductance seen by the power supply; but add the magnetic fields, and thus maximize the recirculation inductance, during the discharge cycle.

Figure 3:
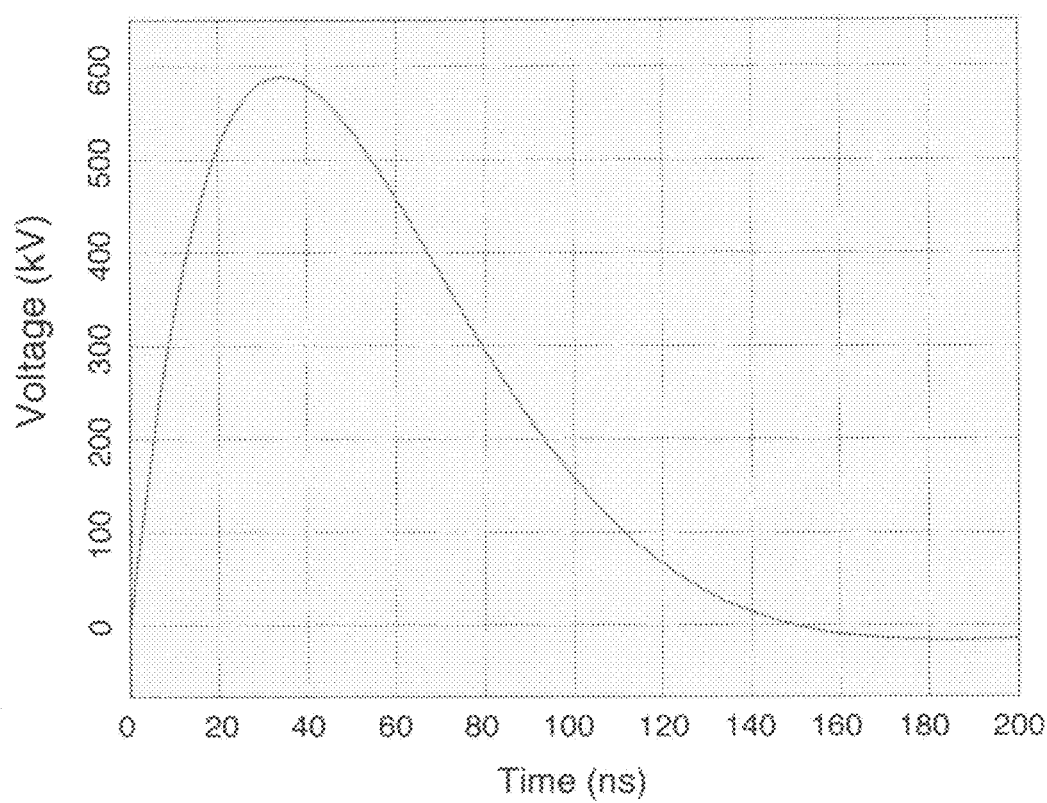
FIG. 3 is a generic double exponential waveform from a Marx Generator.

After the charge cycle is complete, the discharge cycle (Marx "erection") is initiated by triggering the plurality of semiconductor switches shown in FIG. 1, and denoted by reference numbers $Sw_1$ through $Sw_N$ by illuminating them with photons from an optical source (or sources). Typical photon sources consist of pulsed lasers, diode lasers, or fiber lasers. The photons are delivered to the semi-conductor switches either directly from the optical source (or sources), or transmitted by fiber optic cables that are fed by one or more photon sources. The photons create electron-hole pairs within the body of the semiconductor, thereby increasing the quantity of charge carriers and initiating current conduction. Semiconductor materials appropriate for the switch, include, but are not limited to, Silicon, Silicon-Carbide, and Gallium-Nitride. Moreover the semiconductor switch may be either a homogeneous bulk material, or a multi-layer device, such as a five layer asymmetric thyristor. A small quantity of photons may be used to initiate current conduction, which may thereafter be sustained by self generated charge carriers (such as a multilayer optically triggered thyristor); or large quantities of photons may be rapidly supplied to the switch in order to generate sufficient quantities of charge carriers to support the entire switch conduction cycle. Following commencement of switch conduction, the plurality of electrostatic energy storage devices (denoted by $C_1$ through $C_N$ in FIG. 1) that were charged in parallel to the power supply (reference $PS_1$) voltage ($V_0$), are connected in series by the switches, thereby multiplying the voltage to $N*V_0$ at the load element (reference $R_{Load}$), where N is the number of Marx stages. In the typical Marx generator, capacitors are used as the energy storage elements and there are two classical Marx/load circuits. The first erected Marx/load equivalent circuit is represented by a nearly critically damped LCR circuit, where the load resistor has much greater value than the series circuit resistance of the erected Marx. The output waveform will then classically take the form of a double exponential pulse, where the rise time is dominated by the L/R time constant (where L is the series inductance of the erected circuit including the load) and R is the load resistance in addition to the series resistance of the erected circuit. It should be noted that stray capacitance can also affect the pulse rise time. The voltage across the load will be nearly $N*V_0$; and almost all of the stored energy will be delivered to the load. A representative waveform for a twelve stage Marx generator charged to 50 kV per stage is shown in FIG. 3. In some rare cases the equivalent circuit is an underdamped LCR circuit resulting in a damped sinusoidal waveform. The second classical Marx/load circuit is deployed when the Marx is used to charge a capacitor: typically a liquid dielectric Pulse Forming Line (transmission line). In this case the equivalent circuit is underdamped. Moreover, it is frequently desired that the voltage ringup on the load capacitance (pulse forming line) be more than $N*V_0$, which can be accomplished when the load capacitance is less than that of the series erected capacitance of the Marx generator.

Figure 4:
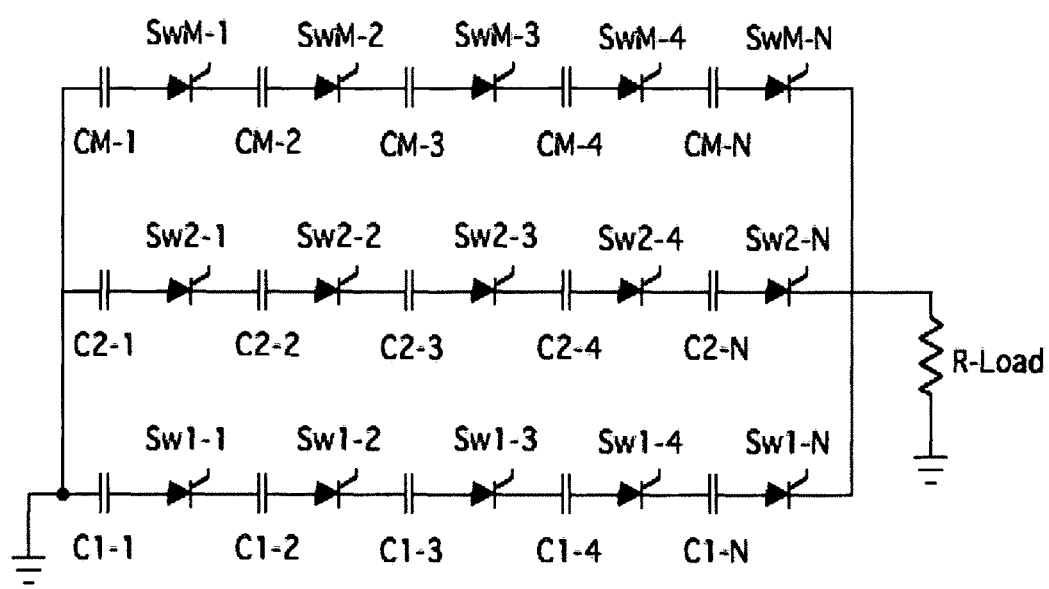
FIG. 4 is a simplified schematic of 'M' parallel (three shown), erected Marx Generators with 'N' Marx stages each.

As illustrated in FIG. 4, the generator may also be constructed of two or more parallel Marx generators in order to drive low impedance loads. Furthermore, a plurality of Marx generators can be constructed with different characteristic impedances and/or triggered at different times to synthesize a variety of pulse shapes, including rectangular and linear ramps.

The plurality of Marx capacitive energy storage elements (as shown by reference numbers $C_1$ through $C_N$ in FIG. 1) may be replaced with a plurality of discrete Transmission Lines, to intrinsically form a flat-topped, rectangular pulse; or Pulse Forming Networks (PFN's) to synthesize a transmission line and thereby generate a flat-topped voltage pulse on the load. The most common PFN configuration is shown in FIG. 5, which illustrates a Type 'E' PFN comprised of seven 'L-C' sections, although the number of sections is arbitrary.

Figure 5:
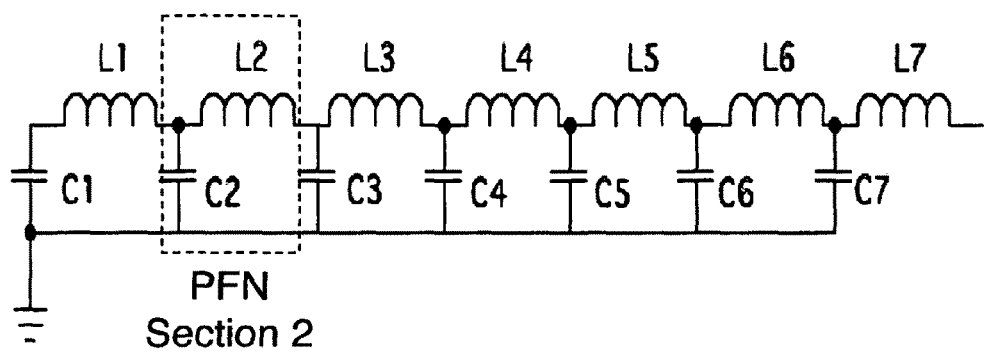
FIG. 5 is a simplified schematic of a seven-section Type 'E' Pulse Forming Network (PFN)
Figure 6:
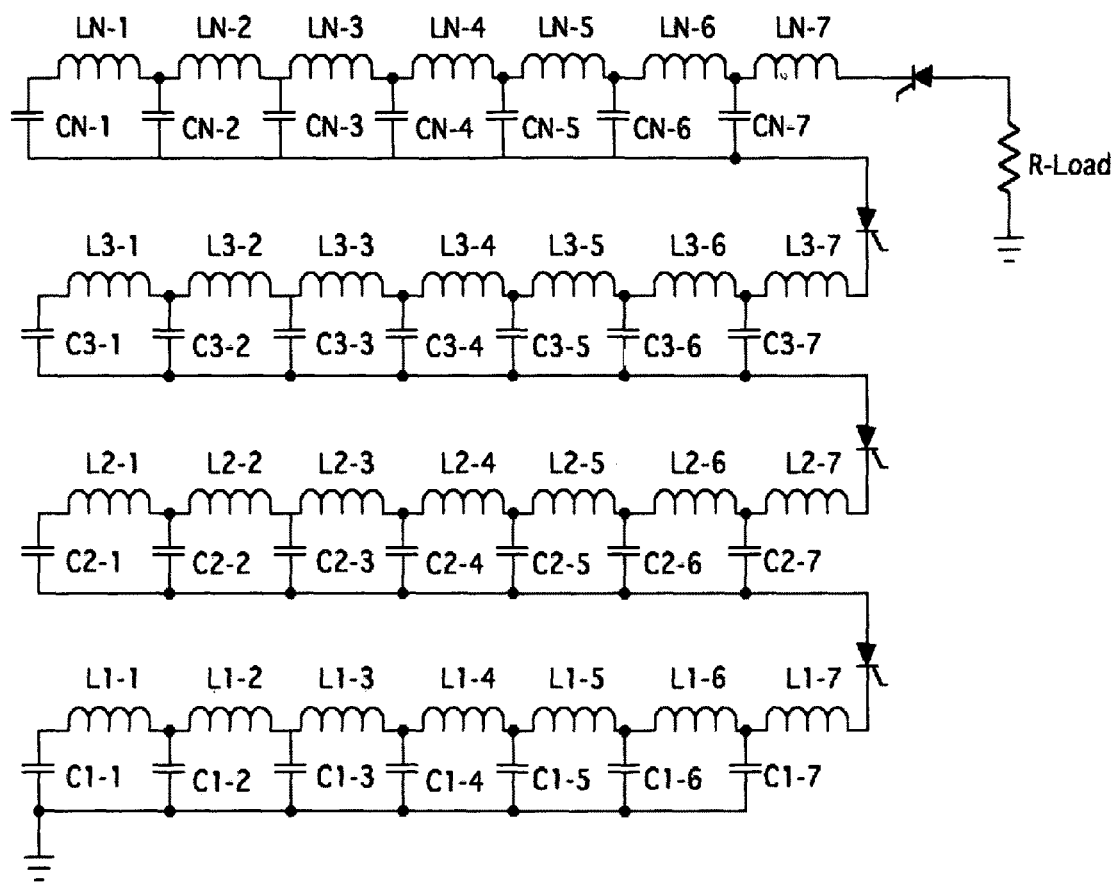
FIG. 6 is a schematic of a Photon Initiated, Marxed Pulse Forming Network with 'N' Marx stages (four shown), each comprised of seven-section Type 'E' PFN's.
Figure 7:
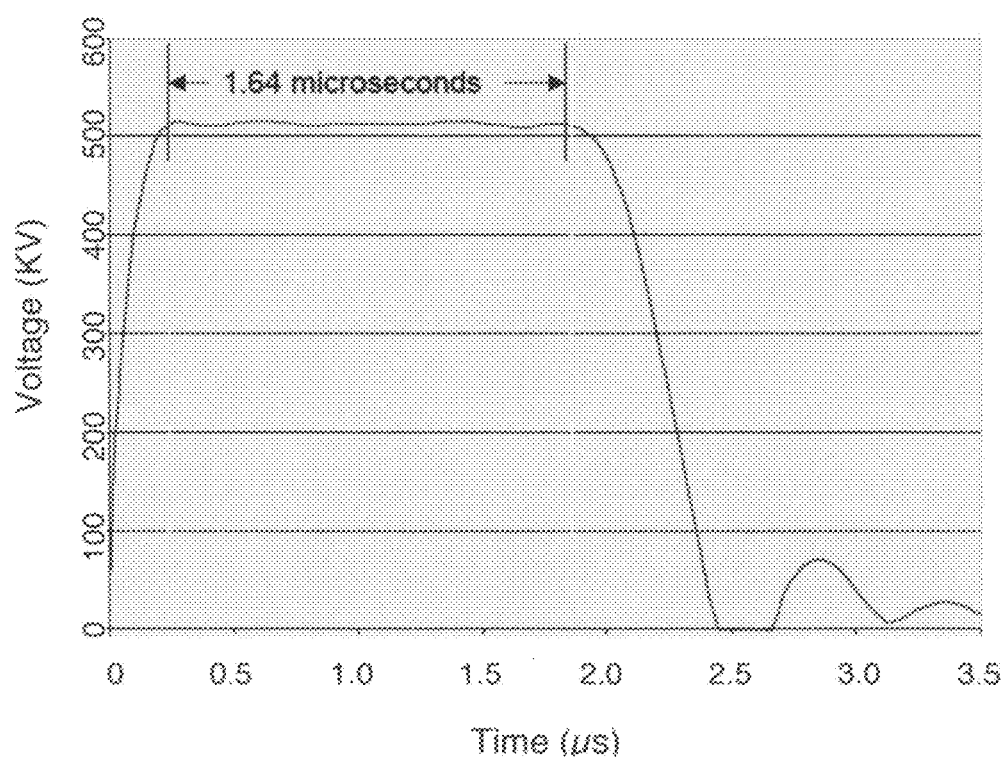
FIG. 7 is a computer model generated waveform from the generic Marxed-PFN circuit shown in FIG. 6, but with 64 Marx stages charged to 16.7 kV each, thus producing a 530 kV, 1.6 µs long flattop pulse.
Figure 8:
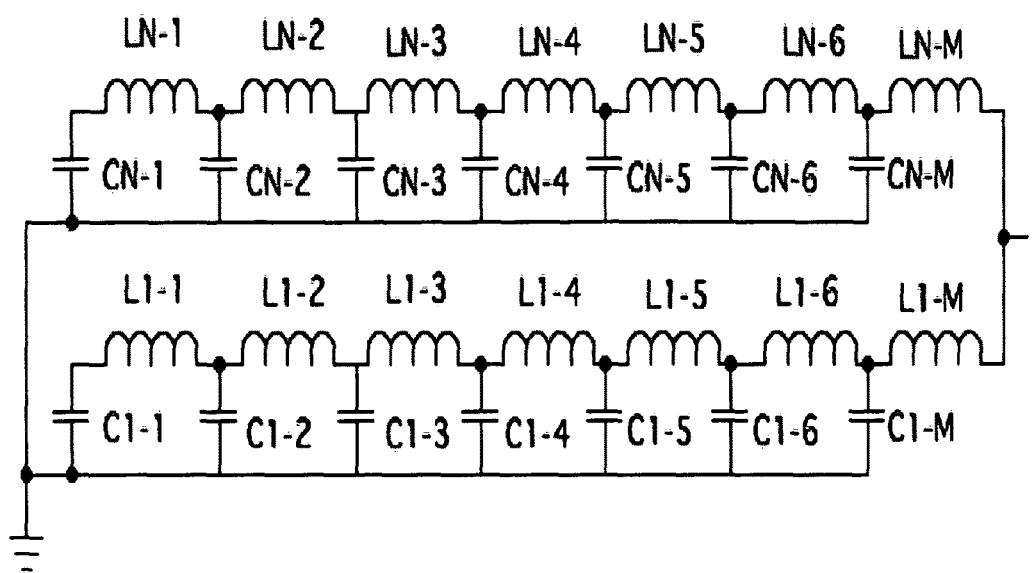
FIG. 8 is a simplified schematic of 'N' parallel (two shown) parallel Type 'E' Pulse Forming Networks (PFN's) with 'M' (seven shown) LC sections each.

The dashed box in FIG. 5 encompasses PFN section 2, which consists of $C_2$ and $L_2$. The resulting Marxed-PFN scheme is shown in FIG. 6, where the Marx has an arbitrary number of stages. Although FIG. 6 depicts each PFN to be constructed of seven L-C sections, the number of sections is arbitrary. The maximum efficiency and best pulse shape for the Marxed PFN configuration are obtained when the load element is predominately resistive and is equal to N times the characteristic impedance of the pulse forming networks. When this condition is met, the voltage across the resistive load is a single rectangular shape with a voltage equal to $(N/2)*V_0$, and the pulse duration is determined by the pulse forming network capacitor and inductor values. FIG. 7 is a computer model generated waveform from the generic Marxed-PFN circuit shown in FIG. 6, but with 64 Marx stages charged to 16.7 kV each, thus producing a 530 kV, 1.6 µs long flattop pulse. The plurality of photon initiated semiconductor switches may be installed in series, to increase the Marx stage voltage; in parallel, to increase the di/dt, peak current, or energy transfer capabilities of the system; or in an "N×M" series/parallel configuration to simultaneously optimize the parameters, as illustrated by the schematic shown in FIG. 2. Resistive or capacitive elements may be installed to grade static or transient pulses across series connected switches, or to insure current sharing in parallel switches. The switches may be constructed of a variety of sizes and aspect ratios to optimize the switch performance to the discharge properties. For example, rectangular switches can yield inherently lower inductance circuits and are therefore advantageous when fast risetimes are required. More than one fiber or optical source may be used to illuminate each switch. Moreover, saturable magnetic cores may be installed in series with each switch (or switch stack/assembly) to delay the current surge until the plasma has spread throughout a larger volume of the switch body, thus enabling higher current and di/dt. Finally, each Marx stage may be comprised of two or more parallel PFN's in order to drive low impedance loads. A simplified schematic depicting two parallel connected PFN's is shown in FIG. 8, where the number of parallel PFN's is represented by 'N'. Moreover, each PFN is comprised of an arbitrary number of sections depicted by 'M'.

Figure 9:
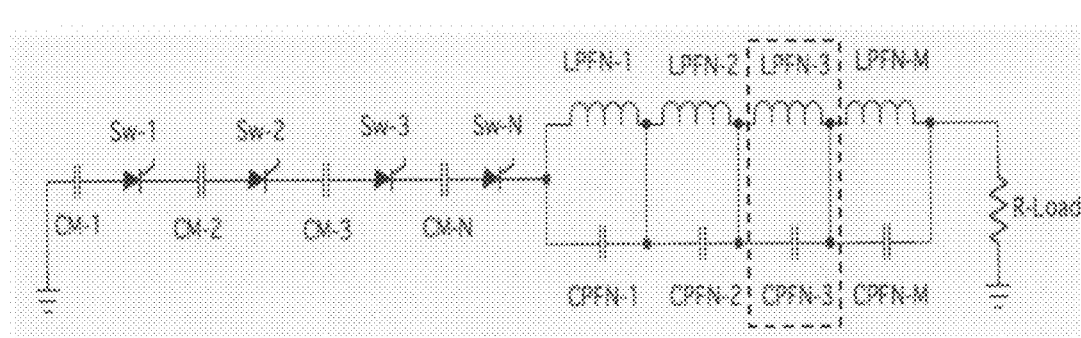
FIG. 9 is a simplified circuit diagram of the present invention (as shown in FIG. 1) with a Type A pulse forming network with 'M' LC sections (four shown) connected to the output of the Marx generator.

There are numerous other methods of shaping the output pulse to obtain the desired voltage and current amplitudes and waveforms on the load without using Pulse Forming Networks at each Marx stage. A Marx generator that uses capacitors to store the energy, naturally generates a double exponential wave shape across a predominately resistive load: where, the pulse risetime is typically dominated by a function of the erected Marx inductance divided by the load resistance, and the fall time is typically dominated by a function of the erected Marx capacitance times the load resistance, as depicted in FIG. 3. However, the Photon Initiated Marxed Modulators described herein, are capable of generating rectangular, flat-topped pulses by adding various pulse shaping components at either the output (high voltage), or input (ground side) of the Marx circuit. For example, a Type-A Pulse Forming Network, consisting of series connected sets of parallel connected capacitors and inductors can be installed at the output of the Marx as shown in FIG. 9. Each set of parallel capacitors and inductors, referenced by the dashed box in FIG. 9, represent one section of a Type-A PFN. Depending on the desired pulse shape on the load, there would typically be from three to five PFN sections installed at the output of the Marx generator.

Figure 10:
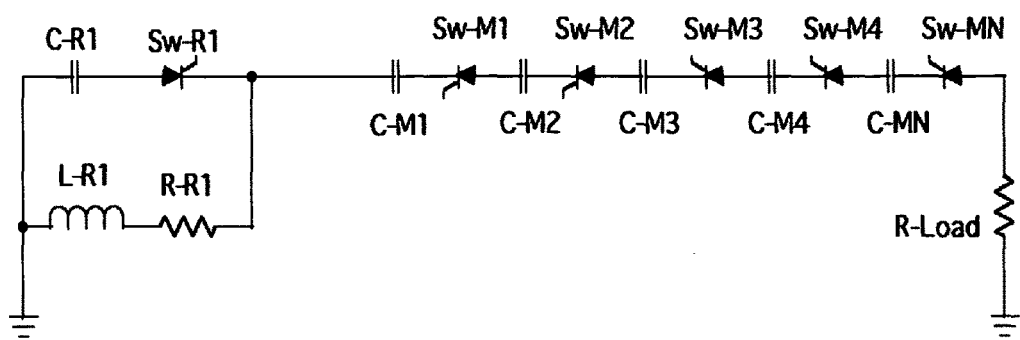
FIG. 10 is a simplified circuit diagram of the present invention (as shown in FIG. 1), with a "first harmonic" Pulse Shaping network across the first stage of the Marx generator.
Figure 11:
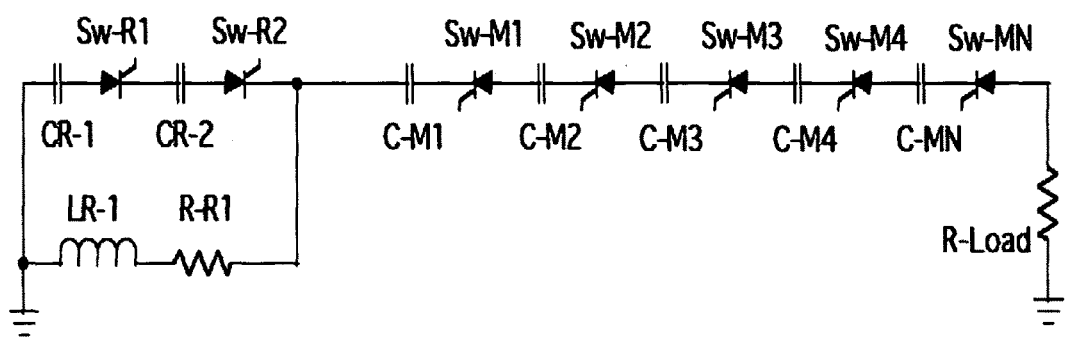
FIG. 11 is a simplified circuit diagram of the present invention (as shown in FIG. 1), with a "first harmonic" Pulse Shaping network across the first two stages of the Marx generator.
Figure 12:
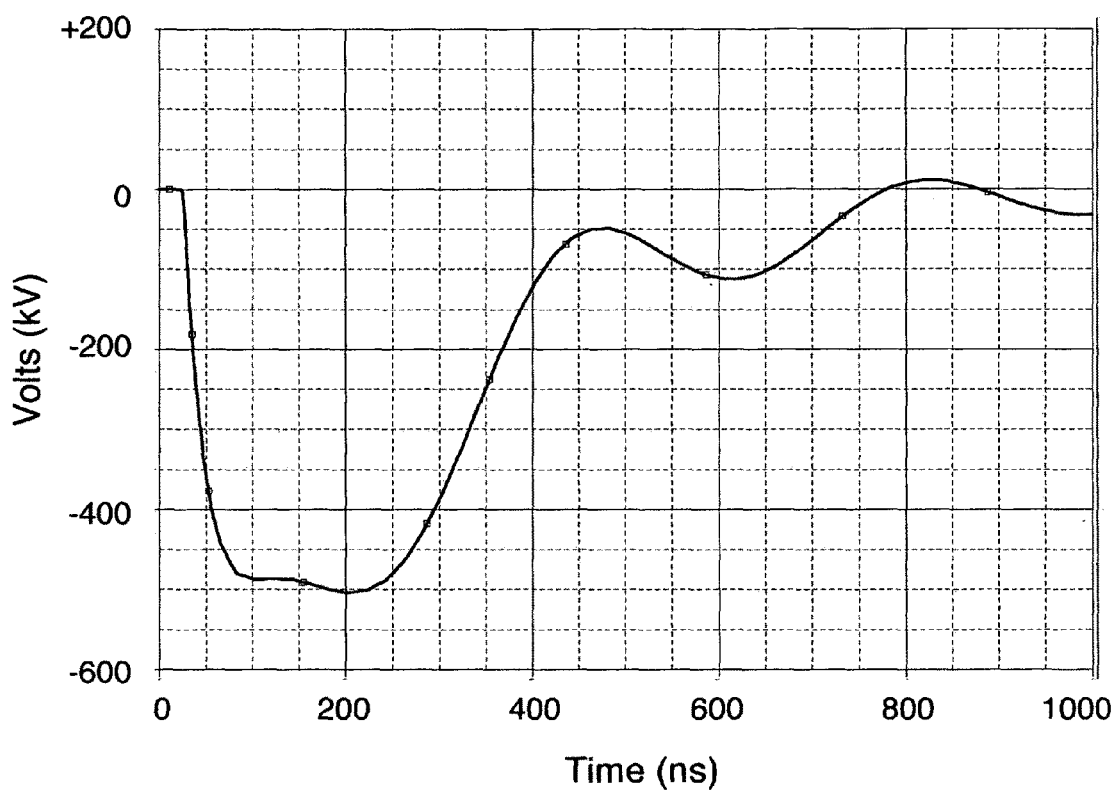
FIG. 12 is a computer model generated waveform from the circuit shown in FIG. 11, demonstrating the nearly flat voltage pulse as compared to the normal Marx waveform shown in FIG. 3.
Figure 13:
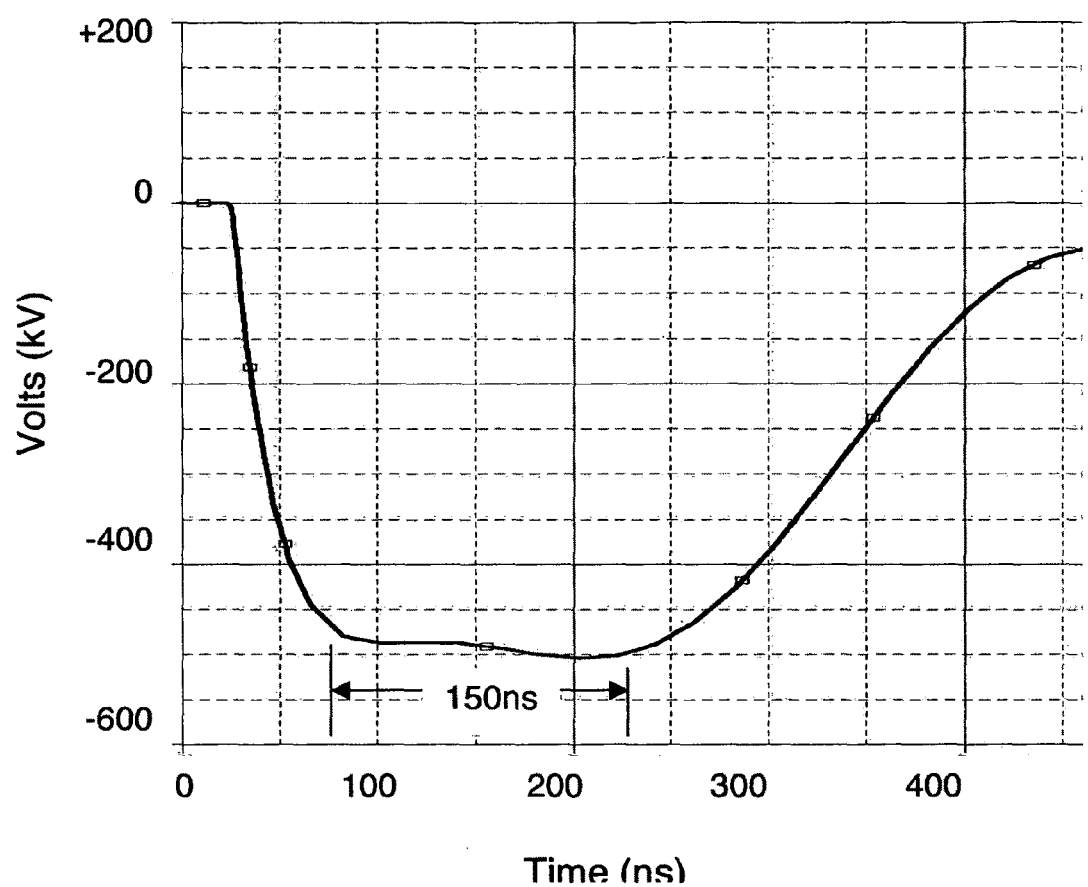
FIG. 13 is an expanded version of the waveform shown in FIG. 11, demonstrating better resolution of the voltage pulse.
Figure 14:
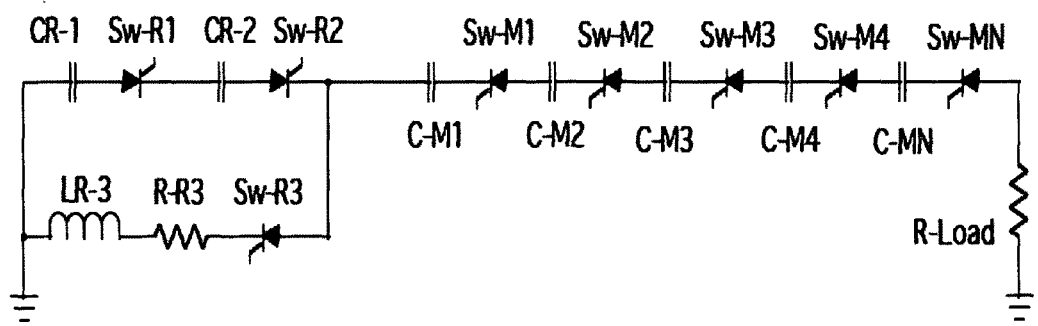
FIG. 14 is a more sophisticated version of the circuit shown in FIG. 10, with a switch added to the "first harmonic" Pulse Shaping network.
Figure 15:
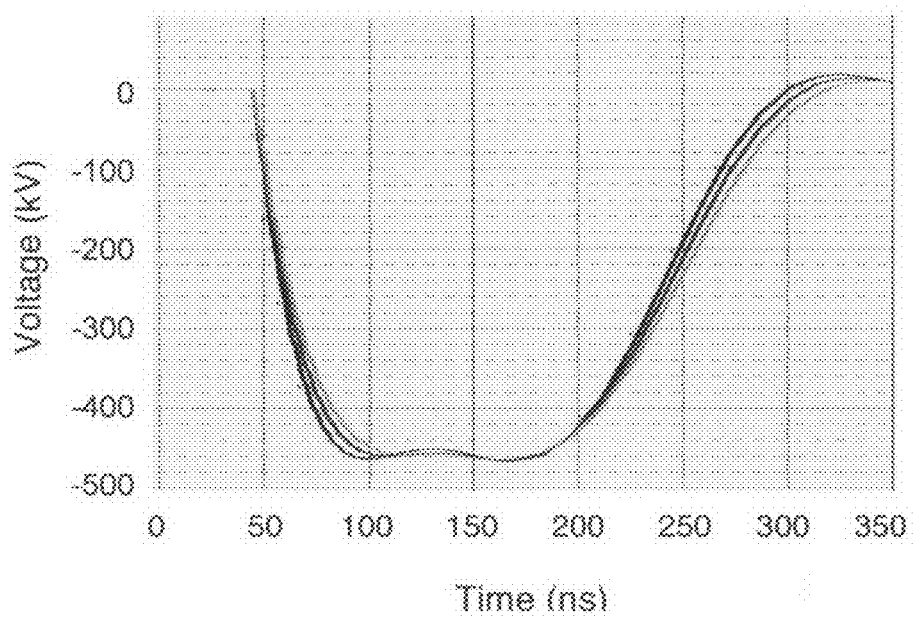
FIG. 15 is a set of computer model generated waveforms from the circuit shown in FIG. 14, demonstrating pulse 'tuning' as a function of the Pulse Shaping switch timing.

Alternatively, one or more inductors may be installed in parallel with the first few Marx stages to generate a correction to the RC fall time nominally associated with a Marx generator with capacitive energy stores. This circuit, referred to as a 'Pulse Shaping' circuit, employs a first harmonic correction to the Marx waveform: FIG. 10 demonstrates a Pulse Shaping circuit whereby the first Marx capacitor and switch are corrected with a first harmonic inductor, while FIG. 11 is representative of the same type of circuit, but with the first two Marx stages included. A typical waveform from the circuit shown in FIG. 11 is shown in FIG. 12, where the circuit has been optimized to power a Relativistic Magnetron with a ~500 kV, ~200 ns wide pulse. The circuit is tuned to generate a 5% increase in the voltage amplitude over the 150 ns duration of the pulse flattop to balance a collapsing impedance electron beam diode load, as shown in FIG. 13. In another variation of the circuit, additional photon initiated switches (referenced by Sw-R2); and possibly resistors denoted by R-R1 may be installed in series with the ringing inductor(s) as shown in FIG. 14. The capacitor values (CR-1) for the Marx stage (or stages) associated with this pulse shaping correction circuit may be different than that of the remaining Marx stages; and the charge voltage amplitude and polarity may also be different than that applied to the remaining Marx stages. These circuits are typically designed to be odd harmonics of the desired fundamental frequency at the load. The switches (Sw-R1 and Sw-R2) associated with the Marx stages that are included in the pulse shape correction circuit may be fired earlier than the remaining Marx stage switches; and switch Sw-R2 can be fired either earlier or later than any of the Marx switches, e.g, it may or may not be synchronous with the firing of switch Sw-R1. If additional switches (Sw-R) are installed in series with the inductors, the firing time of these switches may be optimized to obtain the desired pulse shape at the load. The voltage pulse can thereby be tailored to be flat, or to ramp up (or down) with a specific slope. Examples of pulse shape variations caused by changes in the switch timing are shown in FIG. 15, where the rise time, flattop duration, fidelity of the flattop, and fall time of the pulse are affected. The risetime of the pulse is still dominated by the erected Marx inductance divided by the load resistance; but the rise time, flattop duration and slope, and the fall time of the pulse can be adjusted by switch timing; selection of component (capacitor, inductor, and resistor) values; and charge voltage on the low end Marx capacitors. An additional switch may be installed in parallel with the harmonic inductor(s) (reference LR-1 in FIG. 14) to effectively crowbar the harmonic ringing circuit, thereby decreasing the pulse fall time.

The pulse flattop can be further refined to decrease the overshoot or ripple by installing a plurality of high voltage metal oxide varistors stacks (MOVs) between the output of the Pulse Generator and ground. The varistors clip off voltages greater than their threshold voltage; and can thus be used to clamp the output voltage at a specified level, thereby improving the quality of the flat-top portion of the pulse, while dissipating a minimal amount of energy.

Examples of possible embodiments of this invention are included as follows:

Example 1

Figure 16:
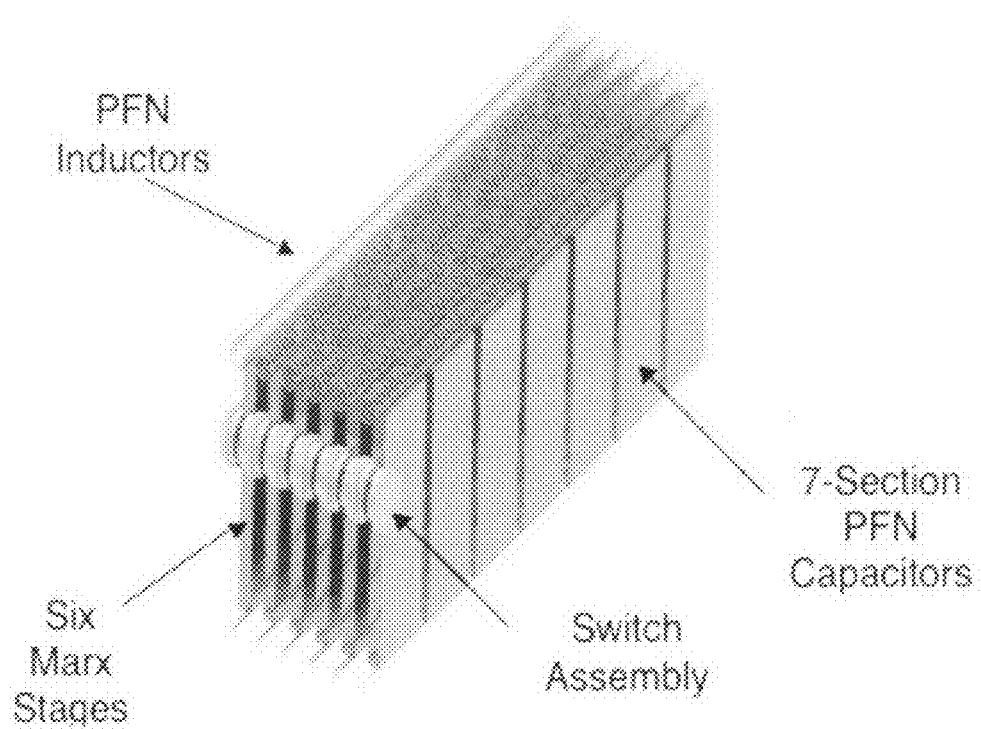
FIG. 16 is a drawing of a possible mechanical configuration for a six stage Marxed-PFN with seven LC sections in each PFN.

The accelerating cavities for linear accelerators are frequently powered by radio frequency electromagnetic pulses that are produced by Klystrons. This invention can satisfy the requirements of such Klystrons: for example, a Photon Initiated Marxed-PFN pulse generator can produce low ripple 500 kV, 530 A, 1.6 microsecond flattop pulses with rise and fall times of less than 300 nanoseconds at repetition rates of at least 120 Hz by Marxing sixty, 15.7 Ohm PFN's (charged to 16.7 kV each) via photon initiated thyristors. FIG. 16 demonstrates a possible mechanical configuration for such a circuit. While FIG. 16 shows only six Marx stages, the number of stages is arbitrary. Likewise, the number of LC sections in each PFN is arbitrary and is not limited to that shown in FIG. 16. The output voltage waveform into a matched load for a sixty-four stage Photon Initiated Marxed-PFN is shown in FIG. 7. The photons required to trigger (and possibly sustain) the photon initiated switches for this configuration can be supplied in a variety of manners, such as a single Q-switched Nd:YAG laser that feeds a fiber optic bundle, thus providing photons to each of the sixty switches via one or more fiber optic cables. The fiber optic cables can be either the same length in order to trigger all of the switches simultaneously, or their lengths can be adjusted to sequentially trigger the switches in the Marx generator. The impedances of the PFN's can be modified slightly in sequential sets to further smooth the flattop portion of the pulse.

Example 2

Present and future requirements for compact, lightweight, robust, rep-rate sources for High Power Microwave Directed Energy (DE) applications cannot be met with conventional components or pulsed power generator circuits. Switching and elimination of pulse transformers and/or water lines are crucial issues for these systems. For example, many High Power Microwave devices, such as Magnetically Insulated Line Oscillators (MILO's), Relativistic Magnetrons, Ubitrons, etc., require relatively flat-topped pulses. Since these devices typically do not demand the extreme flat-topped pulses required by Klystrons for linear accelerators, the waveforms can be generated by adding pulse shaping circuits to Marx generators with capacitor energy storage (as shown in FIGS. 10, 11 and 14), thereby reducing the component count manifest to the Marxed-PFN topology. These devices range in impedance from approximately ten to one hundred Ohms and require pulse durations ranging from about 100 nanoseconds to more than 1 microsecond. An example designed to drive a 500 kV, ~150 ns flat-topped pulse into a ten Ohm MILO, is a manifestation of the basic circuit shown in FIG. 11. A typical waveform for this circuit is shown in FIGS. 12 and 13 (expanded view). Numerous other extensions of the basic circuit concept are feasible.

Example 3

It is possible to synthesize a variety of pulse shapes by triggering (erecting) a plurality of parallel connected Marx generators (reference FIG. 4) at different times. The pulse shapes can be further improved by building the Marxes with different characteristic impedances.

Example 4

Figure 17:
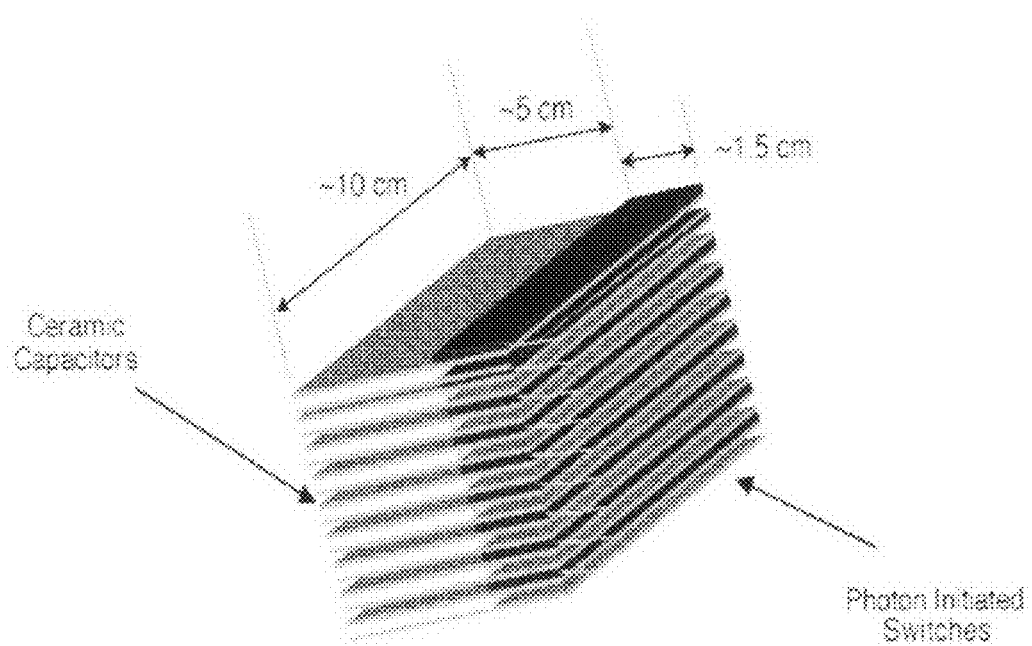
FIG. 17 is an artists concept for a fast, low inductance Photon Initiated Marx Generator (PIMG)
Figure 18:
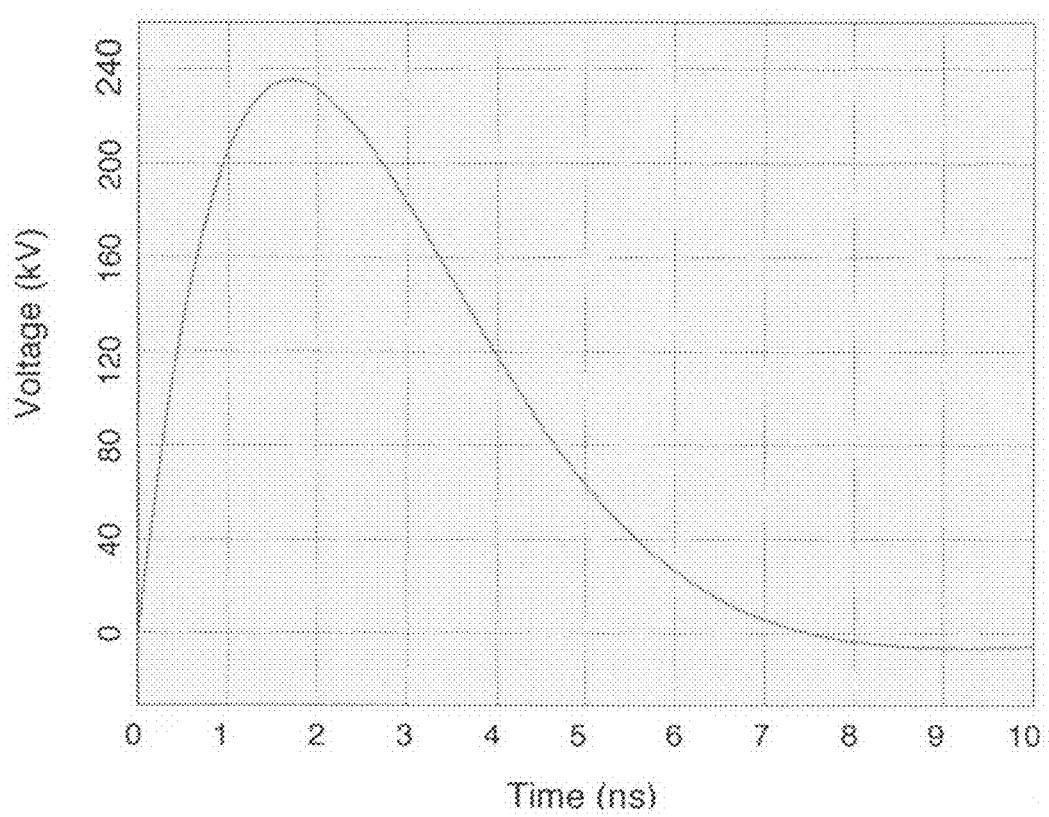
FIG. 18 is a computer generated waveform representative of the circuit shown in FIG. 17 for a fast PIMG.
Figure 19:
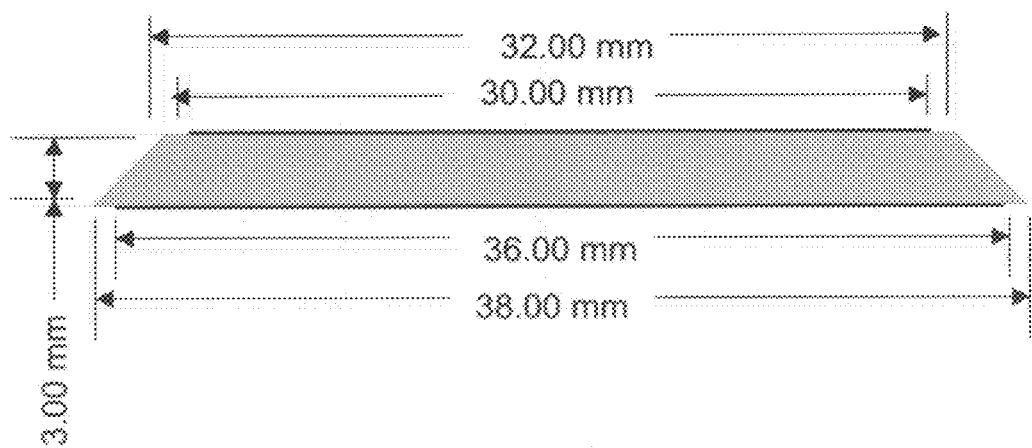
FIG. 19 is a side view drawing of a 1 cm by 3 cm Photon Initiated Thyristor switch.

Impulse radars are representative of a potential application; and Pulse Forming Networks are not required, because a simple L/R current rise and RC decay are the preferred pulse shape. When low inductance configurations are employed, such as that shown by the drawing in FIG. 17 risetimes on the order of one nanosecond and fall times of ~4-10 nanoseconds can be achieved with this invention; yielding a typical waveform as illustrated in FIG. 18.

Example 5

For devices that require extreme flattop pulses, but can tolerate some energy loss, the basic circuits shown in FIGS. 5, 9, 10, 11 and 14 can be equipped with a high voltage metal oxide varistor stack connected to ground between the high voltage output and the load. These varistors, which are commonly used by the electric utility sector for lightening protection, clip off voltages greater than their threshold voltage. Hence, they can be used to clamp the output voltage at a specified level, thus improving on the flat-top portion of the pulse. Varistors will not affect either the rise or fall portions of the pulse. Providing the pulse is relatively flat to start with, the energy lost in the varistors will be small compared to the energy delivered to the load. Varistors would typically not be used with a simple capacitor energy store Marx generator (without any pulse shape correction circuitry), because the energy loss associated with flattening the double exponential pulse would be significant, and the pulse would still have a very long fall time, commensurate with the RC time constant of the Marx generator erected capacitance and load resistance. Further, varistors are non-linear devices whose impedance is a function of the current, making it impossible to obtain an extremely flat pulse from a capacitor energy store Marx generator equipped with a varistor stack.

The preceding examples can be repeated with similar success by substituting the generically or specifically described elements and/or operating conditions of this invention for those used in the preceding examples.

Experimental Results

A test stand, comprising a synthetic transmission line (Pulse Forming Network) representing a single Marx stage with an impedance of 16 Ohms was constructed to produce a rectangular 1.6 microsecond flattop pulse; manifest to a Klystron drive application to produce the radio frequency energy required to power linear accelerators. The photon initiated semiconductor switch was designed for the following requirements: switched voltage: 17 kilovolts; current: 530 amps; risetime: <200 nanoseconds; charge transfer: ~0.001 Coulombs/pulse; switched energy: 8 Joules per pulse; jitter: <1 nanosecond; repetition rate: >120 pulses per second; pulse width (duration) 1.6 microseconds; and lifetime: ~$10^9$ pulses. These parameters were chosen because these are the requirements specified for Klystron powered radio frequency linear accelerator applications. An existing Photon Initiated Thyristor was employed as the switch, and ceramic capacitors were used for the PFN energy storage elements. A single long solenoid type inductor was tapped with turns that resulted in the desired pulse shape. The PFN used seven Pulse Forming sections for these tests. Each section consisted of two parallel, 20 kV, 4 nF ceramic capacitors, to yield a section capacitance of 8 nF. The inductor was constructed by wrapping #10 solid copper wire around a 2.5" diameter PVC pipe that had partial grooves cut by a lathe with a pitch of 5 turns per inch. The distance between section (capacitor) centers was 2.5"; hence there were ~12.5 turns per section.

The completed PFN was interfaced with a quasi-symmetric photon initiated thyristor with onboard laser diode illumination arrays at its anode and cathode surfaces; and terminated with a sixteen Ohm resistive load. The photon initiated semiconductor switch was a ~0.64 $cm^2$ active area silicon device. The switch held off the full design voltage of 16.7 kV, and conducted the full current, di/dt, and action commensurate with a full power Marxed-PFN stage. The current waveform demonstrated a two hundred nanosecond (200 ns) risetime to approximately five hundred and thirty (530) amps, and a relatively flattop voltage pulse with a duration of approximately 1.6 microseconds. The continuous repetition rate PFN discharge testing was limited to five pulses per second (5 pps) due to power supply limitations in the present test bed.

Following the full action switch demonstration, the Test Stand was reconfigured to demonstrate the switch recovery capability at one hundred and twenty (120) Hertz. The PFN was removed and replaced with a capacitor to reduce the action. The holdoff voltage remained the same, the current and di/dt were increased significantly, and the action was decreased significantly—to minimize heat buildup in the switch. The device was operated at one hundred and twenty (120) Hertz for a thirty second burst in order to document switch recovery and holdoff. The one hundred and twenty (120) Hertz demonstration was conducted with reduced charge transfer action in order to stay within the present power limitations for the test bed. The test was significant, however, because it demonstrated recovery to full blocking voltage in a representative inter-pulse interval commensurate with one hundred and twenty (120) Hertz operation. These switches have a minority carrier lifetime of between sixty (60) and one hundred (100) microseconds; which scales to repetitive operation beyond one thousand (1000) Hertz.

Figure 20:
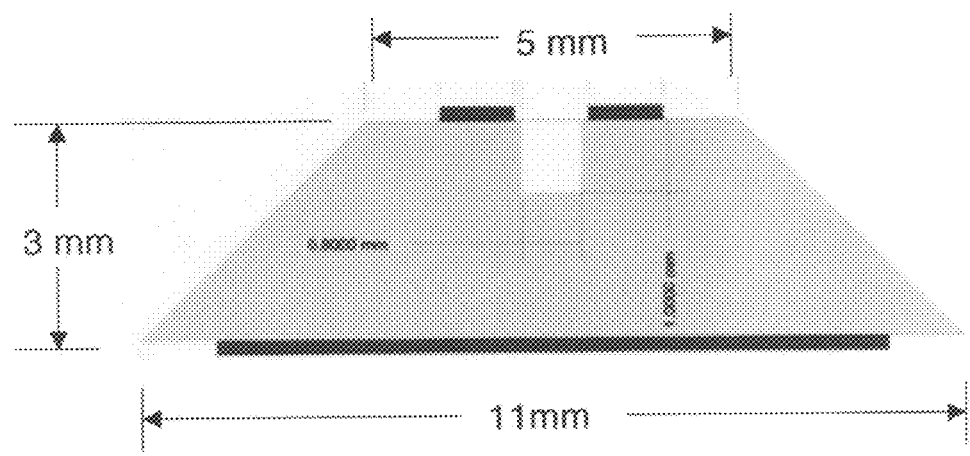
FIG. 20 is an end view drawing of a 1 cm by 3 cm Photon Initiated Thyristor showing the axial groove for the fiber optic cable.
Figure 21:
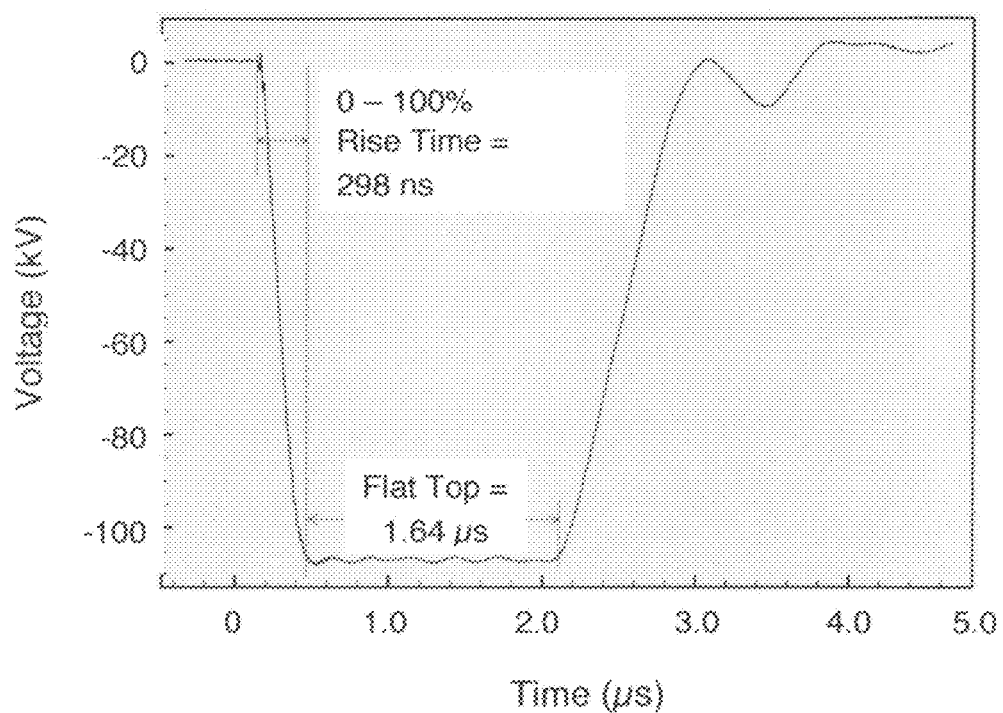
FIG. 21 is a waveform from a prototype Marxed-PFN, when charged to 30 kV per stage (two series photon initiated switches)

A second prototype photon initiated thyristor switch with a 10 mm by 30 mm wide by 3 mm thick cross-section, as shown in FIG. 20, and FIG. 21, was illuminated with photons from a Nd:YAG laser delivered by a fiber optic cable. The fiber optic cable coating was selectively removed to permit the light to escape axially along the length of the switch. More than ten million shots were accumulated on this switch at a pulse repetition rate of 50 Hz.

Photon initiated optically triggered thyristor switches have been successfully integrated into Marxed-Pulse Forming Network circuits to generate direct drive pulses commensurate with Klystron RF tubes for linear accelerator applications. A full scale Photon Initiated-Marxed Modulator (PIMM) was designed to drive two parallel Klystrons. The voltage and current for each Klystron is about 500 kV and 265 A, respectively, based on a nominal Klystron perveance of 0.75 µpervs. The load impedance then, is approximately V/I/N, where N is the number of parallel Klystrons.

A PFN must be charged to twice the desired load voltage when operated into a nominal matched load. Hence, the Marxed PFN must erect to 1000 kV open circuit in order to deliver 500 kV to the Klystrons, when the impedance of the erected Marxed-PFN matches that of the parallel set of Klystrons. The load impedance for a parallel set of two Klystrons is approximately 950 Ohms and the impedance of the erected PIMM must be the same. The impedance of each Marx stage is the erected Marx impedance divided by the number of stages, which is principally determined by the stage switch voltage. Selecting ~31.3 kV per stage (two series switches) and 32 stages produces ~500 kV into a matched impedance load, yielding a Marx stage impedance of ~29.5Ω.

Selecting a pulse flattop of 1.6 µs, and rise and fall times of ~300 ns; yields an equivalent capacitance per Marx stage (PFN) of ~31.5 nF, and an equivalent inductance per stage of ~28 µHy. A seven section PFN was selected: hence, the section capacitance is ~4.5 nF, and the section inductance is ~4 µHy. An eighth section was added to the design just to make sure that the flat-topped pulse width could be generated.

The principal PFN components include the energy storage capacitors. Variable pulse forming inductors, Marx charge and discharge isolation elements, and fault protection. The pulse forming was accomplished via eight section, modified 'Type E' PFN. Extensive modeling was completed to refine the parameters as closely as possible prior to manufacture/procurement. A schematic of four Marxed-PFNs is shown in FIG. 6. The full-scale modulator was designed to have thirty-two Marxed-PFNs, based on a 31.3 kV charge voltage with two series optical thyristors serving as a PFN (Marx stage) switch at 15.7 kV each.

A ¼ scale PIMM Test Stand comprised of eight, 29.5Ω Marxed-PFN stages, each charged between 30 and 33.4 kV was built and validated. When discharged into a matched resistive dummy load of 236Ω; the output pulse was designed to be ~420-134 kV and ~530 amps with a ~1.6 µs flattop. Each Marxed-PFN stage was mounted onto a single bus bar that also served as a structural backbone. The bus bars are held at ground potential during the charge cycle and rise to high voltage only for the duration of the pulse. Each of the PFN bus bars is installed inside an Extren fiberglass channel to provide additional voltage isolation during the discharge cycle.

The PFN's are approximately five feet long (including the switch assembly, fault protection circuitry, and Charge Isolation Inductors); they are spaced on four inch centerlines, resulting in a width of approximately 32" for the eight PFN, ¼ Scale Prototype; and they are about eight inches tall. A full modulator would employ a vertical zig-zag configuration where there might be sixteen PFN's on the bottom level and another sixteen on the upper level: yielding a tank size of approximately 64" wide by 18" tall by 60" long, with an additional 3' dedicated to the Klystrons. Different aspect ratios and more compact packaging will be straightforward. The optical thyristor switch assemblies are in the foreground; the capacitors are enclosed in the white plastic cases seem immediately behind the switch assemblies; the PFN inductors are the bare copper wound coils that span the length of the PFN's; and the air core Marx charge/isolation inductors are the white objects in the far back of the photograph. The fault protection circuitry, which cannot be seen in the photograph, are mounted just in front of the charge/isolation inductors.

The 4.5 nF, 40 kV capacitors are constructed of a wound polypropylene dielectric and aluminum foil design to mitigate losses. These capacitors are operated within the range of 30-35 kV (to accommodate variations in the Klystrons), and are highly de-rated in order to achieve the specified lifetime of $5 \times 10^{10}$ shots. The capacitors have double ended electrodes and plastic cases that have standard dimensions of 2.5"×5.9"×3". Although they were larger in physical size than required, these capacitors were selected to achieve the long life performance specifications while maintaining cost restraint. Future systems will probably employ custom designed capacitors to make the PIMM substantially more compact, but the small quantity we procured was not sufficient to economically manufacture non-standard cases or case-less designs.

The tunable inductors that are installed on the first two Marx PFN stages are constructed by winding 12 Ga. solid copper wire around a 2.25" Extren core that has partial spiral grooves cut to accommodate the wire. The inductance range is nominally two times that predicted by computer modeling, e.g., ~8 µHy. Sliding rings with finger stock current contacts are incorporated on the first two PFN's (left hand side of photograph) to enable easy adjustment by simply sliding the contact band along the inductor turns. The remaining inductors were connected with hose clamps, which could also be adjusted, albeit a bit more difficult and time consuming. Every even stage PFN was initially tuned with a +5% impedance variation from the first stage baseline, and every odd stage PFN was initially tuned with a −5% impedance variation from the first stage baseline. This impedance staggering yields pulse flattop smoothing with a smaller number of PFN sections. Final tuning commenced from this baseline. While more precise fine adjustment could be accomplished by sliding flux excluding copper tubes into the center of each of the Extren forms, this proved to be unnecessary to accomplish tuning on the prototype modulator. Later refinements could be incorporated by re-orienting the inductors into the vertical direction and installing said copper tubes attached to insulating rods that penetrate the oil tank lid, thus permitting continuous tuning while in full power operation.

The standard methods of preventing the Marx stages from discharging through their charging elements during erection is to employ resistors, diodes or inductors in the charge legs. Air-core inductors were selected for this application. The cores were wound and mounted such that the mutual coupling reduces the inductance during the charge cycle and increases the inductance during the discharge cycle. This method mitigates the issues with an inductive load seen by the switching power supply, while reducing the size required to minimize the Marx recirculation currents and energy loss. The inductors are designed as Brooks Coils to achieve the minimum size air core design.

The actual inductors are wound with a 10×10 wire matrix (10 kV insulation). The coil inductance of ~1 mHy results in a reactive impedance that is much larger than the 30Ω impedance of the PFN for the 1.6 μs pulse duration. Furthermore, the actual inductance during the discharge is much higher due to the mutual coupling from the adjacent inductors. Calculations indicate that both the charge cycle $I^2R$ losses and the re-circulating discharge cycle losses are very low. Signals on the discharge cycle were too low to trust—within the shot noise. Hence, the losses in the coils are deemed to be insignificant. Finally, the size of these inductors can be reduced substantially for future systems.

The common fault mode for Klystrons is a short circuit, the incidence of which results in current and di/dt doubling and a reverse voltage wave that propagates to the back of the PFN. End of Line Clippers (EOLC) are typically installed to absorb this voltage reversal with a set of diodes and a load resistor matched to the PFN impedance, thus preventing further reflections. The clippers for the PIMM PFN's are build on circuit boards that contain fifteen series connected, 3 kV diodes, each of which are DC graded with metal film resistors, and impulse graded with ceramic capacitor/resistor snubbers. The diode boards are terminated with a 28Ω ceramic resistor to match the PFN impedance and absorb the fault energy without further reflections. The EOLC assemblies are capable of absorbing the full fault current and action for several pulses in a row without incidence, after which the control system senses the fault and ceases the charge cycle to the modulator.

Two series optical thyristors switches, as shown in FIGS. 20 and 21, are contained in a common enclosure. Both DC bias and impulse divider circuits are installed in parallel with the switches to uniformly divide the charge voltage across the switches and to both quench and evenly divide transient voltages across the switches.

A water dummy load was fabricated and flowing water was used to remove the heat generated in the load. The power supply voltage was set locally and confirmed with an external meter. A time delay generator set the pulse repetition rate and the post pulse delay to enable switch recovery. The discharge current and voltage were monitored with a current transformer and a high voltage probe. A 4'×8' by 1.5' deep oil tank was fabricated to house the PIMM Test module. The synthetic oil "Luminol B", from Petro-Canada, was used as the insulating fluid rather than transformer oil because Luminol is odorless, less caustic, environmentally friendly, and has a higher electrical breakdown strength.

Figure 22:
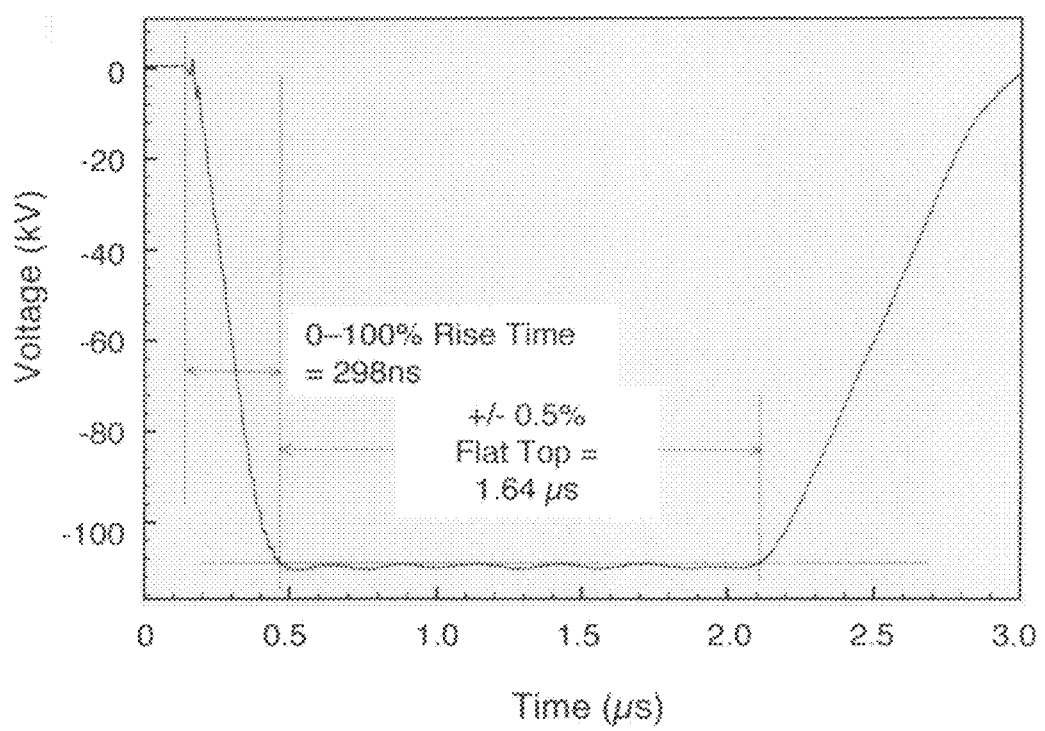
FIG. 22 is an expanded view of the waveform from FIG. 21, demonstrating the flattop fidelity and pulse duration.
Figure 23:
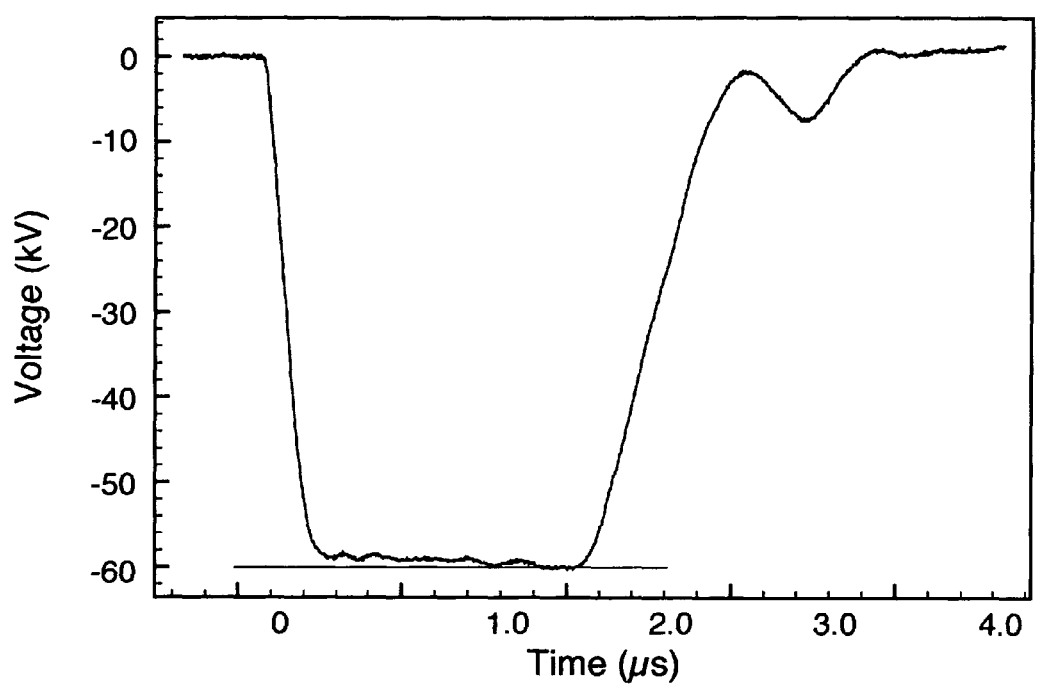
FIG. 23 is a waveform from a prototype Marxed-PFN when tuned to generate a 3% ramp in the voltage flattop to compensate for a collapsing electron beam diode load.

The modulator was tuned to generate a flattop pulse and the charge voltage was increased to 30 kV: yielding a load voltage of 108 kV into a very slightly overmatched load. The pulse shape, as observed in FIG. 21, has a flattop of 1.64 μs with a 0-100% pulse risetime of 298 ns. The pulse is expanded in FIG. 22, which demonstrates a pulse flattop ripple of less than ±0.05%. The results were virtually identical with a charge voltage of 33.4 kV (16.7 kV per switch), except that the load voltage and current increased to ~120 kV, and 564 A, respectively. This is essentially the maximum operating point, e.g., 32 stages would produce a voltage of ~548 kV. The actual voltage would depend on how well the PFN impedance matched the load and the PIMM would be have to be adjusted to accommodate the actual Klystron e-beam load. As shown in FIG. 23, the PIMM was then re-adjusted to demonstrate a 3% voltage ramp typical to the collapsing electron beam diode load on a Klystron.

Lifetime tests were then performed at 50 Hz, starting with 10 minute runs at 10 kV, then one hour runs (~180,000 shots). The voltage was raised in 5 kV increments and the tests repeated until the operational charge voltage of 30 kV was attained (~108 kV at the load). The life tests were started with a series of ~1×10$^7$ pulse runs (~56 hours each) at full voltage. Two ten million shot runs were accomplished without incident and the system performed flawlessly with absolute pulse reproducibility.

These experimental runs were crucial to understanding the nuances of the PIMM system and its components, including the switches, electrodes and current contacts, fiber feeds, stack integrity and maintenance requirements, PFN components, tuning stability, fault tolerance, pulse fidelity, and efficacy.

CONCLUSION

The features of this invention allow construction and operation of a variety of high voltage, high repetition rate pulse generators of the Marx type that are switched with photon initiated semiconductor switches. These photon initiated semi-conductor switches can be constructed with bulk materials or in layered devices such as thyristors. Variations on the invention permit the formation of nearly rectangular, flat-topped, high voltage pulses. Although the invention has been described in detail with particular reference to these preferred embodiments, other embodiments can achieve the same or nearly identical results without departing from the scope of the invention. Variations and modifications of the present invention will be obvious to those skilled in the art and it is intended to cover in the appended claims all such modifications and equivalents. The entire disclosures of all references, applications, patents, and publications cited above are hereby incorporated by reference.

What is claimed is:
1. A high voltage, repetition rate pulse generator of the Marx type comprising:
 a plurality of Marx stages comprising:
  a plurality of electrostatic energy storage elements connected in parallel;
  a plurality of photon initiated semiconductor switches of the closing type connected in series with said electrostatic energy storage elements;
 a plurality of charge/isolation elements;
 a means of charging said electrostatic energy storage elements;
 a means of illuminating said photon initiated semiconductor switches with photons; and
 a means of shaping the output voltage waveform characteristics to generate a variety of pulse shapes, including those that are nearly rectangular.

2. The device of claim 1, wherein said electrostatic energy storage elements associated with each Marx stage are Pulse Forming Networks;
    wherein, said Pulse Forming Networks are comprised of pairs of capacitors and inductors connected as line type Pulse Forming Networks;
    wherein, said Pulse Forming Network inductors have mechanical adjustment/tuning capabilities to optimize the pulse shape with respect to the pulse risetime, voltage overshoot, voltage ripple, pulse duration, and pulse fall time; and
    wherein, resistors are connected to one or more of the Pulse Forming Networks to improve the pulse shape.

3. The device of claim 2, wherein a plurality of Pulse Forming Networks are connected in parallel to improve the pulse shape, and accommodate a broader range of impedances, and a broader range of current, di/dt, and energy transfer capabilities.

4. The device of claim 1, wherein said electrostatic energy storage elements associated with each Marx stage are comprised of discrete Transmission Lines;
    whereas, the charge voltage is equal to or greater than 5 kV;
    whereas, the stored energy is equal to or greater than 0.25 J; and
    whereas, the pulse duration is equal to or greater than 10 ns.

5. The device of claim 1, wherein a plurality of Marx generators are connected in parallel:
    whereas, parallel connected Marx generators accommodate a broader range of load impedances; and
    whereas, parallel connected Marx generators accommodate increased current, di/dt, and energy transfer capabilities.

6. The device of claim 1, wherein said photon initiated semiconductor switches are comprised of a plurality of layers of semiconductor materials including, but not limited to, Silicon, Silicon Carbide, and Gallium Nitrite;
    wherein, said semiconductor materials are configured in a variety of ways including, but not limited to, monolithic, diode and thyristor architectures;
    wherein, said semiconductor switches have 0.5 cm$^2$ or more active area; and
    whereas, said semiconductor switches will withstand greater than 5 kV; and
    whereas, said semiconductor switches will individually transfer at least 0.25 J in a single pulse.

7. The device of claim 1, wherein said photon initiated semiconductor switches associated with each Marx stage are connected in an N by M series-parallel matrix to extend performance parameters;
    wherein said photon initiated semiconductor switches are connected in series to increase the voltage holdoff capability of individual Marx voltage multiplication stages; and
    wherein said photon initiated semiconductor switches are connected in parallel to increase the energy transfer, current amplitude and time derivative capabilities of the pulse generator.

8. The device of claim 1, wherein saturable magnetic materials are installed in series with the photon initiated switches to improve current and di/dt capabilities by providing a time delay between the arrival of the photon flux and the onset of the current surge.

9. The device of claim 1, wherein the means of activating said photon initiated semiconductor switches is a plurality of photon sources comprised of lasers, laser diodes, fiber lasers, barrier discharge devices, or other monochromatic or polychromatic photon producing devices.

10. The device of claim 9, wherein said plurality of photon sources produce a quantity of photons sufficient to:
    produce all of the charge carriers necessary to conduct the entire current pulse in a plurality of multi-layer semiconductor switches; or
    produce a quantity of charge carriers sufficient to initiate current conduction in a plurality of multi-layer semiconductor switches and trigger the self generation of further charge carriers necessary to conduct the remaining current pulse.

11. A high voltage, repetition rate pulse generator of the Marx type comprising:
    a plurality of Marx stages comprising:
        a plurality of electrostatic energy storage elements connected in parallel;
        a plurality of photon initiated semiconductor switches of the closing type connected in series with said energy storage elements;
        a plurality of charge/isolation elements;
        a means of charging said electrostatic energy storage elements;
        a means of illuminating said photon initiated semiconductor switches with photons; and
        a means of shaping the output voltage waveform characteristics to generate a variety of pulse shapes, including those that are nearly rectangular:
            wherein, the pulse shape is modified by installing additional circuits comprising:
                a plurality of capacitor and inductor pairs connected to the terminus (high voltage end) of the Marx to form a Type A Pulse Forming Network, or;
                a plurality of inductors, resistors and switches connected in parallel with a plurality of input (low voltage end) Marx stages;
                whereas, the pulse shape of the Marx is modified to be nearly rectangular or ramped, or;
                whereas, a plurality of input Marx stages is charged with polarity inverted to that of the remaining Marx stages, or;
                whereas, a plurality of input Marx stages is charged with polarity identical to that of the remaining Marx stages, or;
                whereas, the circuit comprised of the plurality of input Marx stage capacitors and the parallel connected inductors and resistors is tuned to a frequency that is a function of the desired flattop duration, or;
                whereas, the switches in the plurality of input Marx stages are fired at times different than those in the remaining Marx stages, or;
                whereas, the plurality of switches in the branch connected in parallel to the plurality of input Marx stages are fired at times different than those in the plurality of input Marx stages, or;
                whereas, the plurality of switches in the branch connected in parallel to the plurality of input Marx stages are fired at times different than those of the remaining Marx stages, or;
            a magnetic switch connected to the terminus of the Marx, or;
            a peaking circuit comprised of capacitors and a high voltage switch connected to the terminus of the Marx, or;

a plurality of metal oxide varistor stacks connected between the high voltage output and ground (prior to the load) to reduce the pulse overshoot and ripple, or;

a plurality of inductors, resistors and switches connected to each of the Marx stage capacitors.

12. A high voltage, repetition rate pulse generator of the Marx type comprising:

a plurality of Marx stages comprising:

a plurality of electrostatic energy storage elements connected in parallel;

a plurality of photon initiated semiconductor switches of the closing type connected in series with said energy storage elements;

a plurality of charge/isolation elements;

a means of charging said electrostatic energy storage elements;

a means of illuminating said photon initiated semiconductor switches with photons;

a means of shaping the output voltage waveform characteristics to generate a variety of pulse shapes, including those that are nearly rectangular:

wherein, said charging is accomplished through a plurality of charge/isolation elements comprised of:

coupled pairs of inductors in the positive and negative charge/isolation legs that are configured to cancel the magnetic fields during the charge cycle to mitigate power supply issues, and to add the magnetic fields during the discharge cycle to minimize losses; or a plurality of diodes in the positive charge/isolation leg; and a plurality of electrically or optically triggered, or photon initiated semiconductor switches or inductors, in the negative charge/isolation leg.

13. A high voltage, repetition rate pulse generator of the Marx type comprising:

a plurality of Marx stages comprising:

a plurality of pairs of capacitors and inductors connected as line type Pulse Forming Networks synthesized to generate nearly rectangular pulses;

a plurality of silicon or silicon carbide photon initiated semiconductor thyristor switches connected in series with said Pulse Forming Networks;

a plurality of charge/isolation elements, and a means of producing, conditioning, and distributing photons and illuminating said photon initiated semiconductor thyristor switches with a quantity of photons sufficient to initiate thyristor switch conduction.

14. The high voltage, repetition rate pulse generator of the Marx type of claim 13, wherein the quantity of photons sufficient to initiate thyristor switch conduction is also sufficient to complete thyristor switch conduction.

15. A high voltage, repetition rate pulse generator of the Marx type comprising:

a plurality of Marx stages comprising:

a plurality of discrete charged Transmission Lines that, when discharged, shape the pulse into nearly rectangular pulse shapes;

a plurality of silicon or silicon carbide photon initiated semiconductor thyristor switches connected in series with said Transmission Lines;

a plurality of charge/isolation elements, and a means of producing, conditioning, and distributing photons and illuminating said photon initiated semiconductor thyristor switches with a quantity of photons sufficient to initiate thyristor switch conduction.

16. The high voltage, repetition rate pulse generator of the Marx type of claim 15, wherein the quantity of photons sufficient to initiate thyristor switch conduction is also sufficient to complete thyristor switch conduction.

17. A plurality of parallel connected high voltage, repetition rate pulse generators of the Marx type comprising:

a plurality of Marx stages comprising:

a plurality of electrostatic energy storage elements connected in parallel;

a plurality of photon initiated semiconductor switches of the closing type connected in series with said electrostatic energy storage elements;

a plurality of charge/isolation elements;

a means of charging said electrostatic energy storage elements;

a means of illuminating said photon initiated semiconductor switches with photons; and a means of illuminating said photon initiated switches with a quantity of photons sufficient to initiate switch conduction:

whereas, the parallel connected Marx generators are triggered at different times to synthesize a variety of pulse shapes, including, but not limited to, rectangles, trapezoids, ramps, triangles, and sinusoids; and whereas, the parallel connected Marx Generators are constructed with different characteristic impedances to further improve the pulse shape.

18. The high voltage, repetition rate pulse generator of the Marx type of claim 17, wherein the quantity of photons sufficient to initiate thyristor switch conduction is also sufficient to complete thyristor switch conduction.

* * * * *